US006832554B2

(12) United States Patent
Miller et al.

(10) Patent No.: US 6,832,554 B2
(45) Date of Patent: Dec. 21, 2004

(54) SYSTEM FOR DIRECT-TO-PRESS IMAGING

(75) Inventors: Nicki R. Miller, Ft. Collins, CO (US); Barbara Nüssel, Rochester, NY (US); Jianbing Huang, Trumbull, CT (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/609,732

(22) Filed: Jun. 30, 2003

(65) Prior Publication Data

US 2004/0103801 A1 Jun. 3, 2004

Related U.S. Application Data

(62) Division of application No. 09/911,159, filed on Jul. 23, 2001, now Pat. No. 6,610,458.

(51) Int. Cl.[7] .......................... B41F 31/02; G03F 7/038; G03F 7/09

(52) U.S. Cl. ....................... 101/465; 101/478; 101/425; 101/467; 430/302; 430/944; 430/945

(58) Field of Search ............................. 101/463.1, 465, 101/466, 467, 470, 471, 472, 478, 425, 492, 483; 430/302, 270.1, 348, 944, 945

(56) References Cited

U.S. PATENT DOCUMENTS

| | | | | | |
|---|---|---|---|---|---|
| 4,743,091 | A | * | 5/1988 | Gelbart | 36/112.24 |
| 5,129,321 | A | * | 7/1992 | Fadner | 101/467 |
| 5,713,287 | A | * | 2/1998 | Gelbart | 101/467 |
| 5,995,475 | A | * | 11/1999 | Gelbart | 369/112.24 |
| 6,125,756 | A | * | 10/2000 | Nüssel et al. | 101/478 |
| 6,242,156 | B1 | * | 6/2001 | Teng | 430/270.1 |
| 6,298,780 | B1 | * | 10/2001 | Ben-Horin et al. | 101/478 |
| 6,487,970 | B2 | * | 12/2002 | Verschueren et al. | 101/467 |
| 6,541,183 | B2 | * | 4/2003 | Teng | 430/302 |
| 6,596,464 | B2 | * | 7/2003 | Van Damme et al. | 430/302 |
| 6,694,880 | B1 | * | 2/2004 | Mori et al. | 101/478 |
| 6,694,881 | B2 | * | 2/2004 | Verschueren et al. | 101/467 |
| 6,723,491 | B2 | * | 4/2004 | Hannoch | 430/302 |

* cited by examiner

*Primary Examiner*—Eugene H. Eickholt
(74) *Attorney, Agent, or Firm*—Faegre & Benson LLP

(57) ABSTRACT

A direct-to-press imaging method comprises:

(a) applying an imageable coating to a printing cylinder, wherein the imageable coating comprises a composition such as a thermally switchable polymer which changes affinity for a printing fluid upon exposure to imaging radiation such as infrared radiation delivered imagewise via a laser, and the imageable coating is substantially insoluble in the printing fluid;

(b) imagewise exposing the imageable coating to actinic radiation to obtain an imaged coating;

(c) printing a plurality of copies of an image from the imaged coating; and (d) reapplying the imageable coating as desired by repeating steps (a) through (c) at least once without substantially removing the prior imaged coating before reapplying the imageable coating.

17 Claims, 3 Drawing Sheets

SYSTEM FOR DIRECT-TO-PRESS IMAGING

CROSS REFERENCE TO RELATED APPLICATION

This application is a divisional application of U.S. patent application Ser. No. 09/911,159, filed Jul. 23, 2001, and titled, "METHOD AND SYSTEM FOR DIRECT-TO-PRESS IMAGING" now U.S. Pat. No. 6,610,458.

BACKGROUND OF THE INVENTION

1. Field of the Invention

This invention is directed to a direct-to-press imaging method and system useful in lithographic printing. More particularly, the imaging method and system of this invention permits an imageable coating to be reapplied to a printing cylinder already having an imaged coating residing thereon, without the need for substantially removing the prior imaged coating before reapplying the new imageable coating.

2. Background Information

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

Lithographic plates may be divided into classes based upon their affinity for printing ink. Those which require dampening water which is fed to the non-image areas of the plate, forms a water film and acts as an ink-repellant layer; this is the so-called fount solution. Those which require no fount solution are called driographs or water-less lithographic plates. Most lithographic plates at present in use are of the first type and require a fount-solution during printing.

Image forming by digital computer aided design of graphical material or text is well known. Electronically derived images of words or graphics presented on the CRT of a digital computer system can be edited and converted to final hard copy by direct printing with impact printers, laser printers or ink jet printers. This manner of printing or producing hard copy is extremely flexible and useful when print runs of no more than a few thousand are required but the print process is not feasible for large runs measured in the tens or hundreds of thousands of pieces. For large runs, printing by lithographic plate is still the preferred process with such plates prepared by the process of photographic image transfer.

As disclosed, for example, at col. 2, line 21 to col. 3, line 10 of co-assigned U.S. Pat. No. 5,908,705 and the references cited therein, and U.S. Pat. No. 5,339,737 and the references cited therein, lasers and their amenability to digital control have stimulated a substantial effort in the development of laser-based imaging systems. Early examples utilized lasers to etch away material from a plate blank to form an intaglio or letterpress pattern. This approach was later extended to production of lithographic plates, e.g., by removal of a hydrophilic surface to reveal oleophilic underlayers. These systems generally require high-power lasers which are expensive and slow.

A second approach to laser imaging involves the use of thermal-transfer materials. With these systems, a polymer sheet transparent to the radiation emitted by the laser is coated with a transferable material. During operation the transfer side of this construction is brought into contact with an acceptor sheet, and the transfer material is selectively irradiated through the transparent layer. Irradiation causes the transfer material to adhere preferentially to the acceptor sheet. The transfer and acceptor materials exhibit different affinities for fountain solution and/or ink, so that removal of the transparent layer together with non-irradiated transfer material leaves a suitably imaged, finished plate. Typically, the transfer material is oleophilic and the acceptor material hydrophilic. Plates produced with transfer-type systems tend to exhibit short useful lifetimes due to the limited amount of material that can effectively be transferred. In addition, because the transfer process involves melting and resolidification of material, image quality tends to be visibly poorer than that obtainable with other methods.

Lasers have also been used to expose a photosensitive blank for traditional chemical processing. In an alternative to this approach, a laser has been employed to selectively remove, in an imagewise pattern, an opaque coating that overlies a photosensitive plate blank. The plate is then exposed to a source of radiation with the unremoved material acting as a mask that prevents radiation from reaching underlying portions of the plate. Either of these imaging techniques requires the cumbersome chemical processing associated with traditional, non-digital platemaking.

Lithographic printing plates suitable for digitally controlled imaging by means of laser devices have also been disclosed in the prior art. Here, laser output ablates one or more plate layers, resulting in an imagewise pattern of features on the plate. Laser output passes through at least one discreet layer and imagewise ablates one or more underlying layer. The image features produced exhibit an affinity for ink or an ink-adhesive fluid that differs from that of unexposed areas. The ablatable material used to describe the image is deposited as an intractable, infusible, IR absorptive conductive polymer under an IR transparent polymer film. As a consequence, the process of preparing the plate is complicated and the image produced by the ablated polymer on the plate does not yield sharp and distinct printed copy.

Because it is desirable to avoid the use of a developer, so-called "processless" plates have also been developed. Processless plates are imaged prior to being mounted on a printing press. The imaged plate is then mounted on the press, and the press is run briefly to permit the non-imaged areas of the plate to be washed off by the fount solution.

However, as discussed, for example in U.S. Pat. No. 5,713,287, operations involving "off-press" imaging as employed in processless plate technology and subsequent manual mounting of the plate on the press are relatively slow and cumbersome. Accordingly, "on press" imaging methods have been developed to generate the desired image directly on a plate (on the press) or directly on a printing cylinder. For Example:

U.S. Pat. No. 5,317,970 is directed to a method for reversibly regenerating a printing form such as a printing form cylinder. More particularly, after the printing form is imaged, an ionized reactive gas is conducted to the surface of the printing form, and applied thereto, thereby reacting with hydrophobic particles on the surface of the printing form and removing these particles, thus enabling the image on the printing form to be erased so that the form may be reimaged and reused;

U.S. Pat. No. 5,992,323 is directed to a printing process which employs an intermediate transfer element formed in this press by depositing and fixing a hardenable material onto a substrate which is not dismantleable from the press. The substrate and hardenable material each have a different affinity for a colorant vehicle employed in printing, thus the intermediate transfer element includes zones having an affinity for the colorant vehicle and zones without such affinity. After a printing phase, the intermediate transfer element is dismantled by removing the hardenable material by, for example, melting the hardenable material, and removing the hardenable material to permit putting a new hardenable material into place on the substrate;

U.S. Pat. No. 5,713,287 is directed to a system in which a printing cylinder is spray coated with a polymer, and the polymer surface is modified by selective laser irradiation to change its affinity to printing ink. As discussed at col. 5, lines 47–65, after printing, the cylinder is cleaned on the press using a cleaning station to remove ink and the imaged polymer, although complete cleaning is not required. A new polymer coat is then applied over the residue of the prior imaged polymer coating, and subsequently imaged; and U.S. Pat. No. 5,996,499 is directed to a method of on-site preparation of a lithographic printing surface such as a printing cylinder in which a coating is applied to the printing surface, and the surface is imagewise exposed using IR radiation. The coating is a combination of a first thermally reactive chemical which, after imaging, changes its affinity to either ink, water or both, and a second chemical which increases the IR sensitivity of the first chemical after mixed therewith. As discussed at col. 4, lines 27–30, cleaning of the printing surface is performed after each print run, prior to recoating.

In view of the foregoing, it would be advantageous to employ a processless "direct-to-press" imaging method and system which does not require substantially removing a previous imaged composition residing on a printing cylinder prior to recoating and reimaging of the surface. It is one object of this invention to provide such an imaging method and system. Other objects, features and advantages of this invention will be readily apparent to those skilled in the art.

SUMMARY OF THE INVENTION

A direct-to-press imaging method comprises:

(m) applying an imageable coating to a printing cylinder, wherein the imageable coating comprises a composition which changes affinity for a printing fluid (i.e. fount solution and/or ink) upon exposure to imaging radiation such as radiation delivered imagewise via a laser, and the imageable coating is substantially insoluble in the printing fluid;

(n) imagewise exposing the imageable coating to imaging radiation to obtain an imaged coating;

(o) printing a plurality of copies of an image from the imaged coating; and (p) reapplying the imageable coating as desired by repeating steps (a) through (c) at least once without substantially removing the prior imaged coating before reapplying the imageable coating.

The composition which changes affinity for the printing fluid (i.e. a printing ink, fount solution or combination thereof) upon exposure to imaging radiation is preferably a thermally switchable polymer. The imageable coating is preferably applied by spraying upon the preexisting imaged coating which has previously been contacted with a printing fluid and used to deliver a printed image. Although remaining printing fluid must be substantially removed from the imaged coating prior to application of the subsequent imageable coating, application of the subsequent imageable coating is achieved without substantially removing the prior imaged coating itself.

The system of this invention comprises:

(m) a printing cylinder capable of receiving an imageable coating;

(n) a coating unit mounted proximate to the printing cylinder;

(o) a thin layer of an imageable composition formed on the printing cylinder by the coating unit, wherein the imageable coating comprises a composition which changes affinity for a printing fluid upon exposure to imaging radiation, preferably a thermally switchable polymer, and the imageable coating is substantially insoluble in the printing fluid;

(p) an imaging unit mounted proximate to the printing cylinder and operable to imagewise expose the imageable coating to imaging radiation to obtain an imaged coating;

(q) a printing fluid application unit mounted proximate to the printing cylinder and configured to apply printing fluid to the imaged coating to form a printing fluid image thereon; and (r) a transfer system mounted proximate to the printing cylinder and configured to transfer the printing fluid image to a print-receiving medium; and (s) a removal system for substantially removing printing ink, fount solution, water or a combination thereof from the imaged coating after transfer of the printing fluid image to a print receiving medium without substantially removing the imaged coating.

Removal of the printing ink, water, fount solution or a combination thereof may be achieved using, for example, a conventional blanket washer, or by running the press for a small number of additional impressions, without feeding ink or fountain solution, upon completion of printing using a prior imaged coating to transfer the residual printing ink, fount solution, water or combination thereof from the prior imaged coating onto the paper. In one embodiment, this may be achieved via a two step process by first turning off the ink supply and thereafter turning off the fount solution supply.

DETAILED DESCRIPTION OF THE INVENTION

Figure 1:
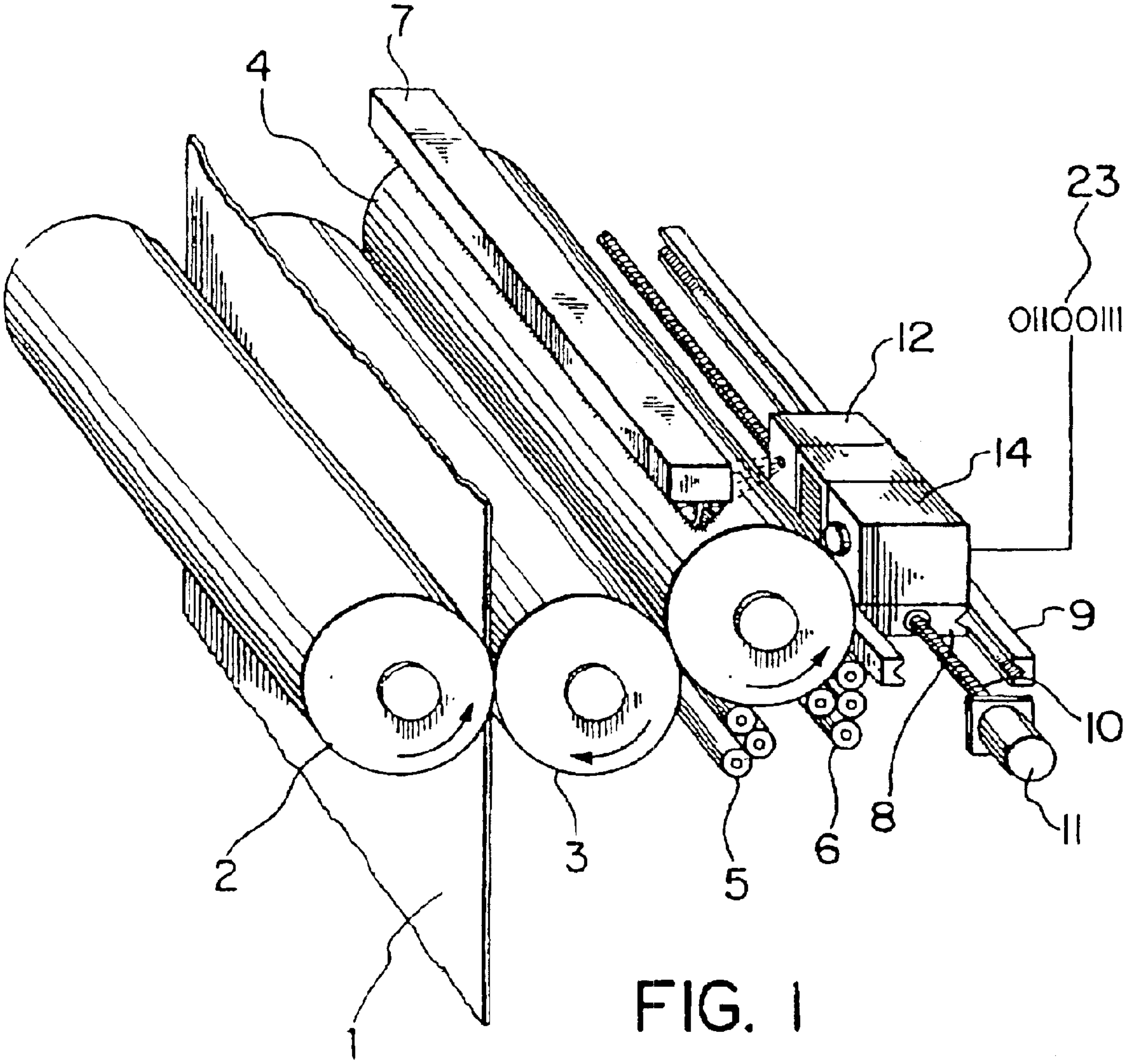
FIG. 1 (Prior Art)
FIG. 1 is a depiction of a lithographic printing press which may be used in accordance with the method and system of this invention.

The system and method of this invention will become apparent from the following detailed description of various preferred embodiments of the invention together with specific references to the accompanying examples.

A master image printing substrate which is preferably a printing cylinder is employed in this invention. Any substrate capable of providing a surface for application of an imageable coating may be employed; however, as this invention is directed primarily to plateless printing applications, the master image printing substrate is preferably a printing cylinder as will be well understood by those skilled in the art. Such printing cylinders are depicted and described, for example, in U.S. Pat. No. 5,713,287 at col. 4, line 48–col. 5, line 45 and incorporated herein by reference. As used herein, the term “printing cylinder” includes a sleeve which may, for example, be metallic which is integral to or fits around the printing cylinder itself. The sleeve may also be removable from the cylinder itself. In such an embodiment, the imageable coating is applied to the sleeve instead of the cylinder itself.

The composition used in this invention in the imageable coating is a composition which changes its affinity for a printing fluid upon exposure to imaging radiation. As used herein, the term “printing fluid” refers to fount solution or ink or a combination thereof, as will be well understood by those skilled in the art. As used herein, the term “imaging radiation” refers to radiation capable of imaging the imageable coating, including but not limited to IR, UV, and UV-vis radiation. The composition is preferably a thermally switchable polymer. Thermally switchable polymers are described, for example, in U.S. Pat. No. 6,190,830, U.S. patent application Ser. Nos. 09/454,151, 09/644,600 and PCT/US00/32841, and U.S. patent application Ser. No. 09/293,389 and PCT/US00/07918. By “switchable” it is meant that the polymer is rendered from hydrophobic to relatively more hydrophilic, or conversely from hydrophilic to relatively more hydrophobic, upon exposure to heat. The thermally switchable polymers which may be used in this invention are discussed below.

The thermally switchable polymers useful in one embodiment of this invention comprise random recurring units at least some of which comprise quaternary ammonium salts of carboxylic acids. Such polymers are described, for example, in U.S. patent application Ser. Nos. 09/454,151 and 09/644,600 and PCT/US00/32841. The polymers generally have a molecular weight of at least 3,000 Daltons and preferably of at least 20,000 Daltons.

The polymer randomly comprises one or more types of carboxylate-containing recurring units (or equivalent anhydride units) units identified as “A” below in Structure 1 and optionally one or more other recurring units (non-carboxylated) denoted as “B” in Structure 1.

The carboxylate-containing recurring units are linked directly to the polymer backbone which is derived from the “A” monomers, or are connected by optional spacer units identified as “X” in Structure 1 below. This spacer unit can be any divalent aliphatic, alicyclic or aromatic group that does not adversely affect the polymer’s heat-sensitivity. For example, “X” can be a substituted or unsubstituted alkylene group having 1 to 16 carbon atoms (such as methylene, ethylene, isopropylene, n-propylene and n-butylene), a substituted or unsubstituted arylene group having 6 to 10 carbon atoms in the arylene ring (such as m- or p-phenylene and naphthylenes), substituted or unsubstituted combinations of alkylene and arylene groups (such arylenealkylene, arylenealkylenearylene and alkylenearylenealkylene groups), and substituted or unsubstituted N-containing heterocyclic groups. Any of these defined groups can be connected in a chain with one or more amino, carbonamido, oxy, thio, amido, oxycarbonyl, aminocarbonyl, alkoxycarbonyl, alkanoyloxy, alkanoylamino or alkaminocarbonyl groups. Particularly useful “X” spacers contains an ester or amide connected to an alkylene group or arylene group (as defined above), such as when the ester and amide groups are directed bonded to “A”.

Structure 1

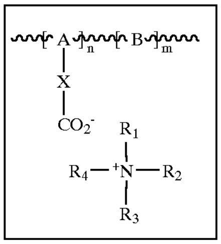

Additional monomers (non-carboxylate monomers) that provide the recurring units represented by “B” in Structure 1 above include any useful hydrophilic or oleophilic ethylenically unsaturated polymerizable comonomers that may provide desired physical or printing properties of the surface imaging layer of the imageable composition or which provide crosslinkable functionalities. One or more “B” monomers may be used to provide these recurring units, including but not limited to, acrylates, methacrylates, styrene and its derivatives, acrylamides, methacrylamides, olefins, vinyl halides, and any monomers (or precursor monomers) that contain carboxy groups (that are not associated with quaternary ammonium ions).

The quaternary ammonium carboxylate-containing polymer may be chosen or derived from a variety of polymers and copolymer classes including, but not necessarily limited to polyamic acids, polyesters, polyamides, polyurethanes, silicones, proteins (such as modified gelatins), polypeptides, and polymers and copolymers based on ethylenically unsaturated polymerizable monomers such as acrylates, methacrylates, acrylamides, methacrylamides, vinyl ethers, vinyl esters, alkyl vinyl ethers, maleic acid/anhydride, itaconic acid/anhydride, styrenics, acrylonitrile, and olefins such as butadiene, isoprene, propylene, and ethylene. A parent carboxylic acid-containing polymer (that is, one reacted to form quaternary ammonium carboxylate groups)

may contain more than one type of carboxylic acid-containing monomer. Certain monomers, such as maleic acid/anhydride and itaconic acid/anhydride may contain more than one carboxylic acid unit. Preferably, the parent carboxylic acid-containing polymer is an addition polymer or copolymer containing acrylic acid, methacrylic acid, maleic acid or anhydride, or itaconic acid or anhydride or a conjugate base or hydrolysis product thereof.

In Structure 1, n represents about 25 to 100 mol % (preferably from about 50 to 100 mol %), and m represents 0 to about 75 mol % (preferably from 0 to about 50 mol %).

While Structure 1 could be interpreted to show polymers derived from only two ethylenically unsaturated polymerizable monomers, it is intended to include terpolymers and other polymers derived from more than two monomers.

The quaternary ammonium carboxylate groups must be present in the thermally switchable polymer useful in this invention in such a quantity as to provide a minimum of one mole of the quaternary ammonium carboxylate groups per 1300 g of polymer, and preferably per 1000 g of polymer, and a maximum of one mole of quaternary ammonium carboxylate groups per 45 g of polymer, and preferably per 132 g of polymer. Preferably, this ratio (moles of quaternary ammonium carboxylate groups to grams of polymer) is from about 1:600 to about 1:132 and more preferably, this ratio is from about 1:500 to about 1:132, or from about 1:500 to 1:45, and more preferably from about 1:300 to 1:45. This parameter is readily determined from a knowledge of the molecular formula of a given polymer.

The quaternary ammonium counterion of the carboxylate functionalities may be any ammonium ion in which the nitrogen is covalently bound to a total of four alkyl or aryl substituents as defined below. In a preferred embodiment, at least one of the four substituents is a substituted-alkylene ($C_1$–$C_3$)-phenyl group.

More particularly, in Structure 1 noted above, $R_1$, $R_2$, $R_3$ and $R_4$ are independently substituted or unsubstituted alkyl groups having 1 to 12 carbon atoms (such as methyl, ethyl, n-propyl, isopropyl, t-butyl, hexyl, hydroxyethyl, 2-propanonyl, ethoxycarbonylmethyl, benzyl, substituted benzyl (such as 4-methoxybenzyl, o-bromobenzyl, and p-trifluoromethylbenzyl), and cyanoalkyl), or substituted or unsubstituted aryl groups having 6 to 14 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl). Alternatively, any two, three or four of $R_1$, $R_2$, $R_3$ can be combined to form a ring (or two rings for four substituents) with the quaternary nitrogen atom, the ring having 5 to 14 carbon, oxygen, sulfur and nitrogen atoms in the ring. Such rings include, but are not limited to, morpholine, piperidine, pyrrolidine, carbazole, indoline and isoindoline rings. The nitrogen atom can also be located at the tertiary position of the fused ring. Other useful substituents for these various groups would be readily apparent to one skilled in the art, and any combinations of the expressly described substituents are also contemplated.

Preferably, at least one of $R_1$, $R_2$, $R_3$ and $R_4$ is a substituted-alkylene ($C_1$–$C_3$)— phenyl group. Any two or all three of the remaining substituents may be combined to form a ring or rings as described above.

Alternatively, multi-cationic ionic species containing more than one quaternary ammonium unit covalently bonded together and having charges greater than +1 (for example +2 for diammonium ions, and +3 for triammonium ions) may be used in this invention.

Preferably, the nitrogen of the quaternary ammonium ion is directly bonded to one or more benzyl groups or one or two phenyl groups. Alternatively, the nitrogen atom is part of one or two five-membered rings, or one or two indoline or isoindoline rings and has a molecular weight of less than 400 Daltons.

The use of a spiro ammonium cation in which the nitrogen lies at the vertex of two intersecting rings is especially preferred. When a carboxylate polymer containing such an ammonium counterion is thermally imaged, small molecule amines are not given off and hence the problem of odor during imaging is alleviated. Similarly, the use of a benzyl-tris-hydroxyethyl ammonium ion may result in the release of triethanolamine that is odorless and relatively benign. This embodiment of the invention is also preferred.

In a preferred embodiment, $R_1$, $R_2$ and $R_3$ are independently linear or branched unsubstituted alkyl groups of 1 to 3 carbon atoms, or linear or branched hydroxyalkyl groups of 1 to 3 carbon atoms that comprise 1 to 3 hydroxy groups as the only substituents (generally only one hydroxy group per carbon atom). More preferably, these radicals are independently methyl, hydroxymethyl, ethyl, 2-hydroxyethyl, 1-hydroxyethyl or 1,2-dihydroxyethyl and most preferably, they are either methyl or 2-hydroxyethyl.

$R_4$ is a substituted alkylenephenyl group that has at least one substituent on either the alkylene or phenyl moiety of the group. More preferably, the one or more substituents are on the phenyl moiety. The alkylene moiety can be linear or branched in nature and has from 1 to 3 carbon atoms (such as methylene, ethylene, n-propylene or isopropylene). Preferably, the alkylene moiety of $R_4$ has 1 or 2 carbon atoms and more preferably, it is methylene. The alkylene moiety can have as many substituents as there are available hydrogen atoms to be removed from a carbon atom. Useful alkylene substituents are the same as those described below in defining the phenyl substituents, but the most preferred substituents for the alkylene moiety are fluoro and alkoxy.

The phenyl moiety of $R_4$ can have from 1 to 5 substituents in any useful substitution pattern. Useful substituents include but are not limited to, halo groups (such as fluoro, chloro, bromo, and iodo), substituted or unsubstituted alkyl groups having from 1 to 12 carbon atoms (such as methyl, ethyl, isopropyl, t-butyl, n-pentyl and n-propyl) that can be further substituted with any of the substituents listed herein (such as haloalkyl groups including trihalomethyl groups), substituted or unsubstituted alkoxy groups having 1 to 12 carbon atoms (such as methoxy, ethoxy, isopropoxy, n-pentoxy and n-propoxy), cyano, nitro, substituted or unsubstituted aryl groups having 6 to 14 carbon atoms in the aromatic carbocyclic ring (as defined above for $R_1$, $R_2$ and $R_3$), substituted or unsubstituted alkyleneoxycarbonyl groups having 2 to 12 carbon atoms (such as methyleneoxycarbonyl, ethyleneoxycarbonyl and i-propyleneoxycarbonyl), substituted or unsubstituted alkylcarbonyloxy groups having 2 to 12 carbon atoms (such as methylenecarbonyloxy, ethylenecarbonyloxy and isopropylenecarbonyloxy), substituted or unsubstituted alkylcarbonyl groups having 2 to 12 carbon atoms (such as methylenecarbonyl, ethylenecarbonyl and isopropylenecarbonyl), amido groups, aminocarbonyl groups, trihalomethyl groups, perfluoroalkyl groups, formyl, mercapto and substituted or unsubstituted heterocyclic groups having 5 to 14 atoms in the ring that includes one or more nitrogen, sulfur, oxygen or selenium atoms with the remainder being carbon atoms (such as pyridyl, oxazolyl, thiphenyl, imidazolyl, and piperidinyl).

Preferably, $R_4$ contains 1 to 5 substituents (more preferably 1 or 2 substituents) on the phenyl moiety, which substituents are either halo groups, substituted or unsubstituted methyl or ethyl groups, or substituted or unsubstituted methoxy or 2-ethoxy groups. More preferably, $R_4$ comprises 1 to 3 methyl, fluoro, chloro, bromo or methoxy groups, or any combination of these groups on either the alkylene or phenyl moiety.

The use of the particular ammonium ions in which all of $R_1$–$R_3$ are 2-hydroxyethyl groups may result in less odor during imaging the heat-sensitive polymer.

Particularly useful thermally switchable polymers of these invention are described below as Polymers 11–23 and 25.

The above described thermally switchable polymers may be readily prepared using many methods that will be obvious to one skilled in the art. Many quaternary ammonium salts and carboxylic acid or anhydride-containing polymers are commercially available. Others can be readily synthesized using preparative techniques that would be obvious to one skilled in the art. Substituted benzyltrialkylammonium salts can be readily synthesized using preparative techniques that would be obvious to one skilled in the art. One convenient method involves the reaction of a substituted benzylamine with a desired alkyl halide, alkyl sulfonate ester or other alkyl-containing compound having a suitable "leaving" group. Another useful method involves the reaction of a substituted benzylic halide with a trialkylamine.

The carboxylic acid or anhydride-containing polymers can be converted to the desired quaternary ammonium carboxylate salts by a variety of methods including, but not necessarily limited to:

1) the reaction of a carboxylic acid- or acid anhydride-containing polymer with the hydroxide salt of the desired quaternary ammonium ion,
2) the use of ion exchange resin containing the desired quaternary ammonium ion,
3) the addition of the desired ammonium ion to a solution of the carboxylic acid-containing polymer or a salt thereof followed by dialysis,
4) the addition of a volatile acid salt of the desired quaternary ammonium ion (such as an acetate or formate salt) to the carboxylic acid-containing polymer followed by evaporation of the volatile component upon drying,
5) electrochemical ion exchange techniques,
6) the polymerization of monomers containing the desired quaternary ammonium carboxylate units, and
7) the combination of a specific salt of the carboxylic acid-containing polymer and a specific quaternary ammonium salt, both chosen such that the undesired counterions will form an insoluble ionic compound in a chosen solvent and precipitate.

Preferably, the first method is employed.

Although it is especially preferred that all of the carboxylic acid (or latent carboxylic acid) functionalities of the polymer are converted to the desired quaternary ammonium salt, imaging compositions in which the polymer is incompletely converted may still retain satisfactory imageability. Preferably, at least 50 monomer percent of the carboxylic acid (or equivalent anhydride) containing monomers are reacted to form the desired quaternary ammonium groups.

In the preferred embodiments of this invention, the heat-sensitive polymer is crosslinked. Crosslinking can be provided in a number of ways. There are numerous monomers and methods for crosslinking that are familiar to one skilled in the art. Some representative crosslinking strategies include, but are not necessarily limited to:

1) the reaction of Lewis basic units (such as carboxylic acid, carboxylate, amine and thiol units within the polymer with a multifuctional epoxide-containing crosslinker or resin,
2) the reaction of epoxide units within the polymer with multifunctional amines, carboxylic acids, or other multifunctional Lewis basic unit,
3) the irradiative or radical-initiated crosslinking of double bond-containing units such as acrylates, methacrylates, cinnamates, or vinyl groups,
4) the reaction of multivalent metal salts with ligating groups within the polymer (the reaction of zinc salts with carboxylic acid-containing polymers is an example),
5) the use of crosslinkable monomers that react via the Knoevenagel condensation reaction, such as (2-acetoacetoxy)ethyl acrylate and methacrylate,
6) the reaction of amine, thiol, or carboxylic acid groups with a divinyl compound (such as bis (vinylsulfonyl) methane) via a Michael addition reaction,
7) the reaction of carboxylic acid units with crosslinkers containing multiple aziridine or oxazoline units,
8) the reaction of acrylic acid units with a melamine resin,
9) the reaction of diisocyanate crosslinkers with amines, thiols, or alcohols within the polymer,
10) mechanisms involving the formation of interchain sol-gel linkages [such as the use of the 3-(trimethylsilyl) propylmethacrylate monomer],
11) oxidative crosslinking using an added radical initiator (such as a peroxide or hydroperoxide),
12) autooxidative crosslinking, such as employed by alkyd resins,
13) sulfur vulcanization, and
14) processes involving ionizing radiation.

Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl) propyl acrylate or methacrylate, cinnamoyl acrylate or methacrylate, N-methoxymethyl methacrylamide, N-aminopropylmethacrylamide hydrochloride, acrylic or methacrylic acid and hydroxyethyl methacrylate.

Preferably, crosslinking is provided by the addition of an epoxy-containing resin to the quaternary ammonium carboxylate polymer or by the reaction of a bisvinylsulfonyl compound with amine containing units (such as N-aminopropylmethacrylamide) within the polymer. Most preferably, CR-5L (an epoxide resin sold by Esprit Chemicals) is used for this purpose.

The imageable composition can include one or more of such homopolymers or copolymers, with or without up to 50 weight % (based on total dry weight of the layer) of additional binder or polymeric materials that will not adversely affect its imaging properties.

The amount of thermally switchable polymer(s) used in the imageable composition is generally at least 0.1 g/m$^2$, and preferably from about 0.1 to about 10 g/m$^2$ (dry weight). This generally provides an average dry thickness of from about 0.1 to about 10 $\mu$m.

The imageable composition can also include one or more conventional surfactants for coatability or other properties, dyes or colorants to allow visualization of the written image, or any other addenda commonly used in the lithographic art, as long as the concentrations are low enough so they are inert with respect to imaging or printing properties.

Preferably, the imageable composition also includes one or more photothermal conversion materials to absorb appropriate radiation from an appropriate energy source (such as an IR laser), which radiation is converted into heat. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful.

One particularly useful pigment is carbon of some form (for example, carbon black). Carbon blacks which are surface-functionalized with solubilizing groups are well known in the art and these types of materials are preferred photothermal conversion materials for this invention. Carbon blacks which are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are especially preferred.

Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include those illustrated as follows:

IR Dye 1

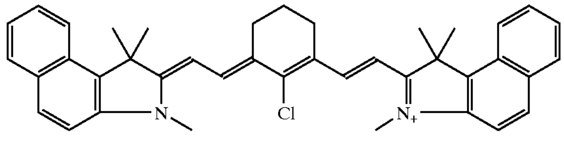

p-toluenesulfonate-

IR Dye 2 Same as Dye 1 but with chloride as the anion.

IR Dye 3

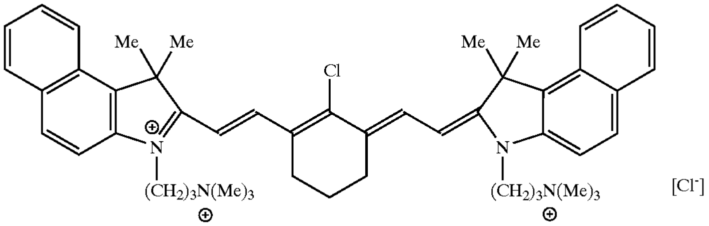

IR Dye 4

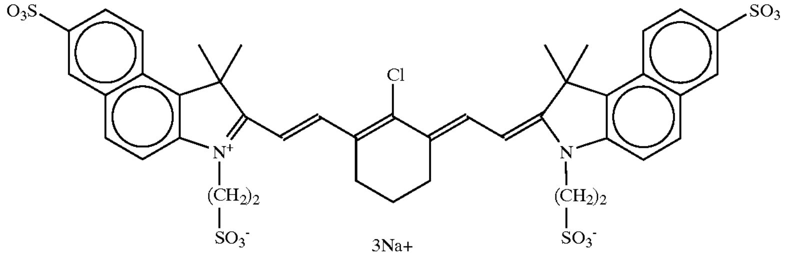

IR Dye 5

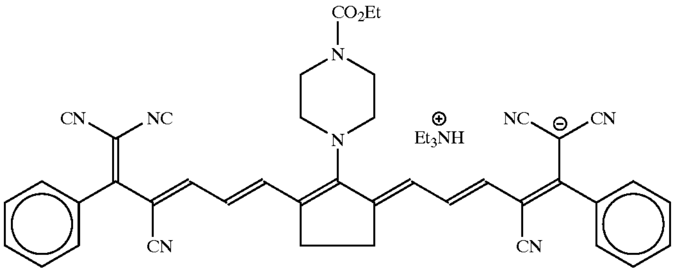

IR Dye 6

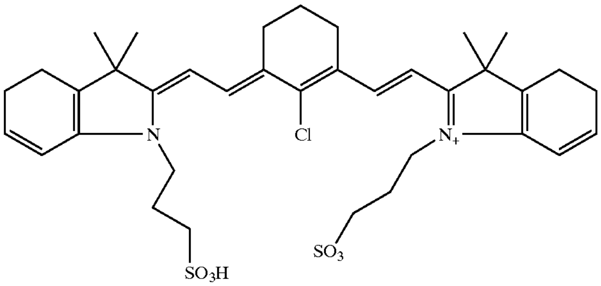

-continued

IR Dye 7

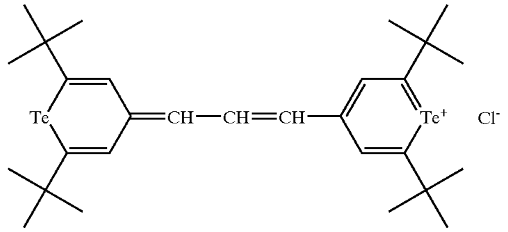

IR Dye 8

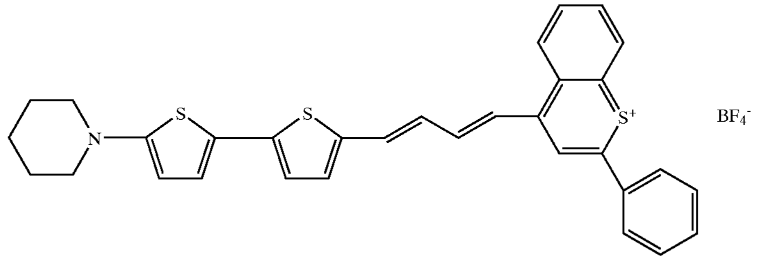

IR Dye 9

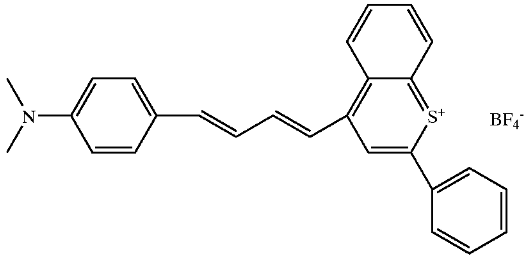

Useful oxonol compounds that are infrared radiation sensitive include Dye 5 noted above and others described in copending U.S. patent application Ser. No. 09/444,695, filed Nov. 22, 1999 by DoMinh et al. and entitled "Thermal Switchable Composition and Imaging Member Containing Oxonol IR Dye and Methods of Imaging and Printing".

The photothermal conversion material(s) are generally present in an amount sufficient to provide an optical density of at least 0.3 (preferably of at least 0.5 and more preferably of at least 1.0) at the operating wavelength of the imaging laser. The particular amount needed for this purpose would be readily apparent to one skilled in the art, depending upon the specific material used.

Alternatively, a photothermal conversion material can be included in a separate layer that is in thermal contact with the heat-sensitive imageable composition residing in an imaging layer. Thus, during imaging, the action of the photothermal conversion material can be transferred to the heat-sensitive polymer layer without the material originally being in the same layer.

The composition comprising the thermally switchable polymer is preferably applied by spraying onto a suitable support (such as an on-press printing cylinder) as described in U.S. Pat. No. 5,713,287 (noted above).

During use, the imageable composition is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al.), incorporated herein by reference. The imaging member is typically sensitized so as to maximize responsiveness at the emitting wavelength of the laser. For dye sensitization, the dye is typically chosen such that its $\lambda_{max}$ closely approximates the wavelength of laser operation.

In the printing drum, the requisite relative motion between the imaging device (such as a laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the thermal energy source can be moved parallel to the drum axis and, after each pass across the imaging member, increment angularly so that the image "grows" circumferentially. In both cases, after a complete scan by the laser beam, an image corresponding to the original document or picture can be applied to the imageable composition.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Without the need for any wet processing after imaging, printing can then be carried out by applying a lithographic printing fluid to the imaging member printing surface, and then transferring the ink to a suitable receiving material (such as cloth, paper, metal, glass or plastic) to provide a desired impression of the image thereon. In one preferred embodiment, a fount solution is first contacted with the imaged coating, and a printing ink is thereafter contacted with the imaged coating. If desired, an intermediate "blanket" roller can be used to transfer the ink from the imaged coating to the receiving material. The imaging members can be cleaned between impressions, if desired, using conventional cleaning means.

The structures of exemplary thermally switchable polymers which may be used in this invention are set forth below:

Polymer 1

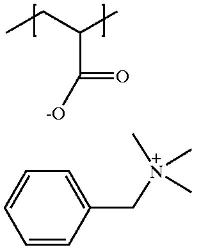

Polymer 2

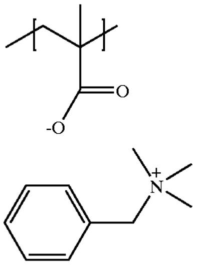

Polymer 3

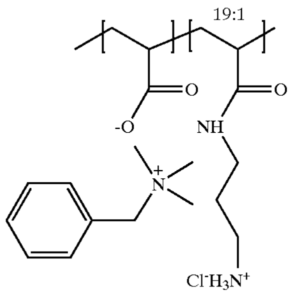

Polymer 4

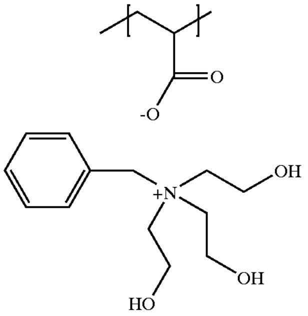

lp;2p

-continued

Polymer 5

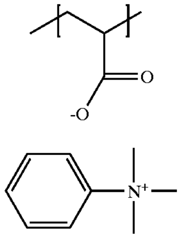

Polymer 6

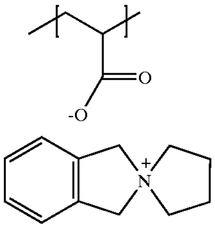

Polymer 7

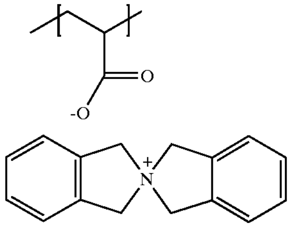

Polymer 8

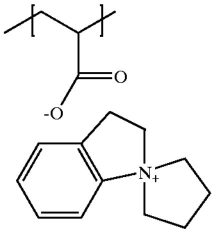

Polymer 9

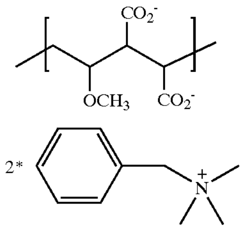

Polymer 10

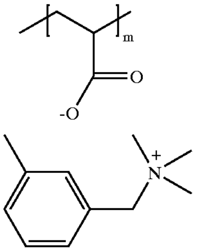

-continued
Polymer 11
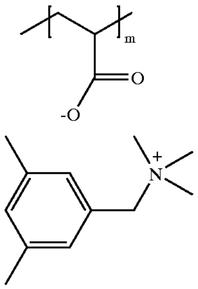
Polymer 12
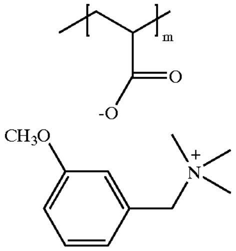
Polymer 13
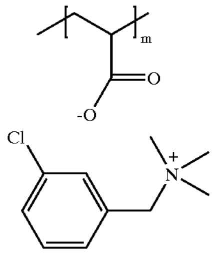
Polymer 14
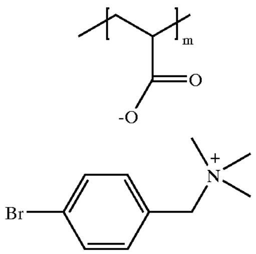
Polymer 15
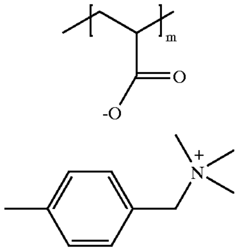
Polymer 16
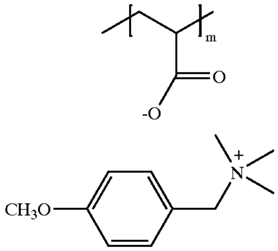
-continued
Polymer 17
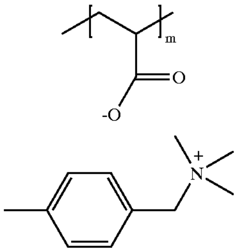
Polymer 18
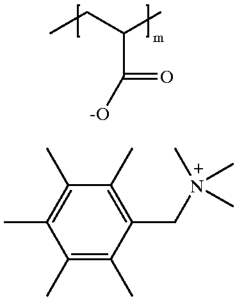
Polymer 19
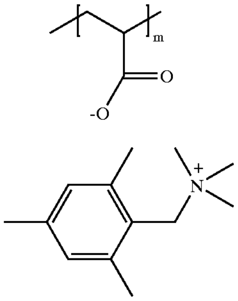
Polymer 20
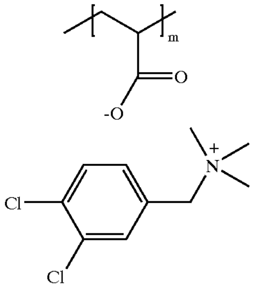
Polymer 21
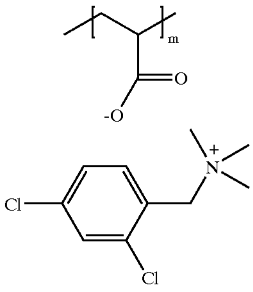

-continued

Polymer 22

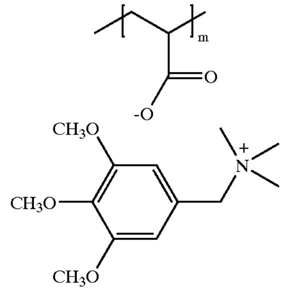

Polymer 23

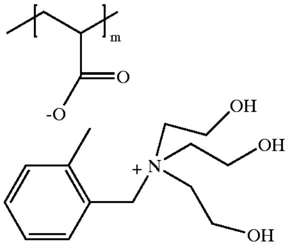

The above-depicted polymers prepared as described below may be characterized as having the ratio of moles of quaternary ammonium carboxylate groups to grams of polymer as shown in TABLE I below:

TABLE I

| Polymer | Ratio |
|---|---|
| 1 | 1:221 |
| 2 | 1:235 |
| 3 | 1:230 |
| 4 | 1:311 |
| 5 | 1:207 |
| 6 | 1:245 |
| 7 | 1:293 |
| 8 | 1:245 |
| 9 | 1:228 |
| 10 | 1:235 |
| 11 | 1:249 |
| 12 | 1:251 |
| 13 | 1:256 |
| 14 | 1:300 |
| 15 | 1:239 |
| 16 | 1:251 |
| 17 | 1:235 |
| 18 | 1:291 |
| 19 | 1:263 |
| 20 | 1:290 |
| 21 | 1:290 |
| 22 | 1:311 |
| 23 | 1:325 |

The preparation of these polymers is described below, and is further described in U.S. patent application Ser. Nos. 09/454,151 and 09/644,600 and PCT/US00/32841.

Preparation of Polymer 1 Solution:

An aqueous solution [60.00 g of a 25% (w/w)] of polyacrylic acid (available from Polysciences, MW~90,000) is combined with 60.0 g distilled water and 84.63 g of a 41.5% (w/w) methanolic solution of benzyltrimethylammonium hydroxide (Aldrich Chemical). A gummy precipitate initially is formed and is slowly redissolved over 30 minutes. The resulting polymer is stored as a 32% (w/w) solution in a water/methanol mixture.

Preparation of Polymer 2 Solution:

A sample (3.00 g) of polymethacrylic acid (available from Polysciences, MW~30,000) is combined with 23.00 g of distilled water and 14.04 of a 41.5% (w/w) methanolic solution of benzyltrimethylammonium hydroxide (Aldrich Chemical). A gummy precipitate is initially formed and is slowly redissolved over 30 minutes. The resulting polymer is stored as a 21% (w/w) solution in a water/methanol mixture.

Preparation of Polymer 3 Solution:

A] A nitrogen-degassed solution of acrylic acid (1.00 g) and 3-aminopropylmethacrylamide hydrochloride (0.13 g) in water (10 ml) are added gradually over one hour using a syringe pump to a rapidly stirring, nitrogen degassed solution of 2,2'-azobis(2-methylpropionamidine) dihydrochloride (0.056 g) in water (20 ml) at 60° C. The reaction solution is allowed to stir at 60° C. for an additional one hour and then precipitated into acetonitrile. The solids are collected by vacuum filtration and dried in a vacuum oven at 60° C. overnight to obtain the product copolymer.

B] A methanolic solution [4.7 ml of a 40% (w/w)] of benzyltrimethylammonium hydroxide (Aldrich Chemical) is added to a solution of the copolymer from step A (0.85 g) in 8.5 ml of distilled water. A gummy precipitate is initially formed and slowly redissolved over 30 minutes. The solution is diluted with water to a total volume of 23 ml (9.2% solids).

Preparation of Polymer 4 Solution:

A] Benzyl tris(hydroxyethyl) ammonium bromide synthesized by the procedure of Rengan et al. (*J. Chem. Soc. Chem. Commun.*, 10, 1992, 757) is dissolved in 250 ml of methanol and 5 ml water in a 500 ml round bottomed flask. Silver (I) oxide (20.56 g) is added and the mixture is stirred at room temperature for 72 hours. The insolubles are filtered off and the filtrates are concentrated to 80 ml by rotary evaporation. The clear solution is passed through a flash chromatography column packed with 300 $cc^3$ DOWEX® 550A OH resin using methanol eluent and concentrated to ~50 ml by rotary evaporation.

B] A 25% (w/w) aqueous solution (12 g) of polyacrylic acid (available from Polysciences, MW~90,000) is combined with 13.30 g of methanol and 30.75 g of the solution from step A. The resulting polymer is stored as a 25% (w/w) solution in a water/methanol mixture.

Preparation of Polymer 5 Solution:

An aqueous solution (8.00 g of a 25% (w/w)) of polyacrylic acid (Polysciences, MW~90,000) is combined with 10.00 g methanol and 12.31 g of a 2.254 meq/g (38.5% w/w) methanolic solution of phenyltrimethylammonium hydroxide (available from TCI America). A gummy precipitate initially is formed and slowly redissolved over 30 minutes. The resulting polymer is stored as a 21% (w/w) solution in a water/methanol mixture.

Preparation of Polymer 6 Solution:

A] Pyrrolidine (48.93 g, Aldrich Chemical) is added using an addition funnel over 30 minutes to a solution of α,α'-dibromo-o-xylene (45.40 g, Aldrich Chemical) in diethyl ether (408 g). Solvent is decanted from the precipitated solid and the crude product is recrystallized from isopropanol, washed three times with diethyl ether, and dried overnight in a vacuum oven at 60° C. to obtain a very hygroscopic powder. The purified product is stored as a solution in methanol of 25.4% solids.

B] The product solution of step A is combined in a 500 ml round bottomed flask with 9:1 methanol:water (130 ml) and silver (I) oxide (16.59 g). The reaction solution is allowed to stir for an hour at room temperature and the insolubles are filtered off. The filtrates are passed through a flash chromatography column packed with 300 $cm^3$ of DOWEX® 550A OH resin using a methanol eluent. The collected fractions are concentrated by rotary evaporation.

C] An aqueous solution (12.00 g of a 25% (w/w)) of polyacrylic acid (Polysciences, MW~90,000) is combined with 11.44 g of methanol and 18.77 g of the solution from step B. A gummy precipitate is initially formed and slowly redissolved over 30 minutes. The resulting polymer is stored as an 18% (w/w) solution in a water/methanol mixture.

Preparation of Polymer 7 Solution:

A] Anhydrous ammonia (Aldrich) is bubbled through a rapidly stirring suspension of α,α'-dibromo-o-xylene (26.36 g, Aldrich Chemical) in absolute ethanol (300 ml) for 2.5 hours. The reaction mixture is placed in a freezer for 2 hours and then filtered. The collected solids are washed once with isopropanol and once with diethyl ether to obtain the quaternary ammonium bromide product.

B] A sample (7.39 g) of the product from step A is converted from the bromide to the hydroxide using 5.65 g silver (I) oxide and 70 ml of a 9:1 methanol:water mixture in an analogous manner as used for Polymer 6 (Step B). A solution is obtained.

C] An aqueous solution (5.02 g of a 25% (w/w)) of polyacrylic acid (Polysciences, MW~90,000) is combined with 14.14 g of methanol and 12.00 g of the solution from step B. A gummy precipitate is initially formed and slowly redissolved over 30 minutes. The resulting polymer is stored as a 16% (w/w) solution in a water/methanol mixture.

Preparation of Polymer 8 Solution:

A] Indoline (Aldrich, 14.06 g), 1,4-bromobutane (Aldrich, 25.48 g) and ammonium hydroxide (28% aqueous solution, Aldrich, 45.0 g) are combined in a 500 ml round bottomed flask fitted with an addition funnel and a condenser. The reaction mixture is heated to reflux and 23.0 g of additional ammonium hydroxide solution are added dropwise over 30 minutes. The reaction solution is heated at reflux overnight and the liquids are evaporated from the crude product using a rotary evaporator. The remaining solids are dissolved in hot isopropanol and filtered hot to remove residual ammonium bromide. The filtrates are concentrated to an orange oil, dissolved in 200 ml methanol, adsorbed onto about 100 $cm^3$ silica gel, and loaded onto the top of a flash chromatography column packed with about 1000 $cm^3$ of silica gel. The column is first eluted with 1:1 ethyl acetate:hexane to remove any organic-soluble impurities, and then with methanol to elute the desired product. The collected methanolic solution is concentrated to an oil on a rotary evaporator to provide the purified spiro-indolinium bromide salt.

B] All of the purified product from Step A is dissolved in 150 ml of a 9:1 methanol:water mixture. It is then converted to the corresponding hydroxide salt with silver (I) oxide (27.34 g) in an analogous manner as used for Polymer 6 (Step B). A solution of 1.300 meq/g of hydroxide anion is obtained.

C] A 25% (w/w) aqueous solution (5 g) of polyacrylic acid (Polysciences, MW~90,000) is combined with 13.34 g of the solution from step B. A gummy precipitate initially is formed and is slowly redissolved over 30 minutes. The resulting polymer is stored as a 23.28% (w/w) solution in a water/methanol mixture.

Preparation of Polymer 9 Solution:

GANTREZ® AN-139 polymer (ISP Technologies, 1.00 g) is added to a solution comprising distilled water (10 g) and 5.36 g of a 40% (w/w) aqueous solution of benzyltrimethylammonium hydroxide (Aldrich Chemical). The resulting mixture is stirred vigorously for 12 hours at which point a clear, homogeneous solution is formed.

Preparation of Solutions of Polymers 10–22:

Polymers 10–22 are all synthesized using a basic three-step process. They are all within the scope of the present invention. The first step involves the reaction of the substituted benzyl halides with 1.5 to 3.0 equivalents of trimethylamine in ether to yield substituted benzyltrimethylammonium halide salts.

The second step involves the conversion of the halide salts to the corresponding hydroxides using 1.0 equivalents of $Ag_2O$ in methanol-water followed by the removal of volatiles to afford solutions with a hydroxide content of 0.5 to 2.5 mEq/g as determined by HCl titration.

The third step is the neutralization of polyacrylic acid (MW=90,000) with the various substituted benzyltrimethylammonium hydroxides to yield solutions (usually 20% w/w) of the polymers in MeOH/water (having weight ratios ranging from 2:1 to 1:2). A representative procedure is described below for making Polymer 10.

Preparation of Polymer 10 solution (3 steps):

A] 3-Methylbenzyl bromide (24.64 g, $1.33\times10^{-1}$ mol, Aldrich) is dissolved in 221 g of diethyl ether in a 500 ml round bottomed flask. A 33% (w/w) solution of trimethylamine in methanol (35.80 g, $2.00\times10^{-1}$ mol, Acros) is added all at once, forming a precipitate almost immediately. The reaction mixture is allowed to stir overnight at room temperature and is then filtered and washed three times with diethyl ether. The resulting powder is dried in a vacuum oven overnight to obtain 3-methylbenzyl trimethylammonium bromide.

B] The bromide salt from step A (10 g) is dissolved in 100 ml of 9:1 methanol/water in a 250 ml round bottomed flask. Silver (I) oxide (9.5 g, $4.10\times10^{-1}$ mol, Aldrich) is added all at once and stirred for two hours. The solids are then filtered off, first using standard filter paper then using a 0.5 μm Millipore FC membrane filter. The filtrates are concentrated to a volume of ~40 ml on a rotary evaporator.

C] A 25% (w/w) aqueous solution (6.04 g) of polyacrylic acid (Polysciences, MW~90,000) is combined with 1.79 g methanol and 17.17 g of the solution from step B. A gummy precipitate initially is formed and slowly redissolved over a 30 minutes. The polymer is stored as a 20% (w/w) solution in methanol-water.

Polymers 11–22 are synthesized using analogous procedures. Variations from the representative procedure are noted where applicable in TABLE II below.

TABLE II

| Polymer # | Substituted Benzyl halide | Step A Conditions | Step A yield | [OH] (mEq/g) of ammonium hydroxide solution (Step 13) |
|---|---|---|---|---|
| 10 | 3-methylbenzyl bromide | Ether, 25° C., 20 hours | 90% | 1.237 |
| 11 | 3,5-dimethylbenzyl bromide | Ether, 25° C., 20 hours | 97% | 1.145 |

TABLE II-continued

| Polymer # | Substituted Benzyl halide | Step A Conditions | Step A yield | [OH] (mEq/g) of ammonium hydroxide solution (Step 13) |
|---|---|---|---|---|
| 12 | 1-bromomethyl-3-methoxybenzene | Ether, 25 C., 20 hours | 98% | 1.204 |
| 13 | 3-chlorobenzyl bromide | Ether, 25° C., 20 hours | 98% | 1.256 |
| 14 | 4-bromobenzyl bromide | Ether, 25 C., 20 hours | 99% | 1.330 |
| 15 | 4-fluorobenzyl bromide | Ether, 25 C., 20 hours | 97% | 0.952 |
| 16 | 4-methoxybenzyl chloride | Ether, 25 C., 20 hours | 84% | 2.220 |
| 17 | 4-methylbenzyl bromide | Ether, 25 C., 20 hours | 98% | 1.372 |
| 18 | pentamethylbenzyl chloride | Ether, 3 eq. $NMe_3$, reflux, 20 hours | 98% | 1.100 |
| 19 | α-chloroisodurene | Ether, 3 eq. $NMe_3$, 20 hours at 25 C. then reflux for 4 hours | 83% | 1.520 |
| 20 | 3,4-dichlorobenzyl chloride | Ether, 3 eq. $NMe_3$, reflux for 24 hours | 54% | 1.09 |
| 21 | 2,4-dichlorobenzyl chloride | Ether, 3 eq. $NMe_3$, reflux, 20 hours | 61% | 1.14 |
| 22 | 3,4,5-trimethoxybenzyl bromide* | Ether, 25 C., 20 hours | 88% | 0.516 |

*3,4,5-Trimethoxybenzyl bromide synthesized from 3,4,5-trimethoxybenzyl alcohol using triphenylphosphine/$CBr_4$.

Preparation of Polymer 23 Solution (3 steps):

A] 2-methylbenzyl bromide (10.00 g, $5.40\times10^{-2}$ mol, Aldrich), triethanolamine (10.48 g, $7.02\times10^{-2}$ mol, Aldrich), and tetrahydrofuran (54 ml) are combined in a 200 ml round bottomed flask fitted with a reflux condenser and a nitrogen inlet. The reaction is stirred at reflux for 14 hours at which point a large amount of a solid has formed. The solid is collected by vacuum filtration, recrystallized from ethanol, and dried overnight in a vacuum oven at 60° C. A fine powder is collected.

B] 10.00 g ($2.99\times10^{-2}$ mol) of the product from step A is converted to the corresponding hydroxide salt using the procedure described for Polymer 2 (step B).

C] 3.38 g of a 25% (w/w) aqueous solution of polyacrylic acid (available from Polysciences, MW~90,000) is combined with 1.60 g of methanol and 15.02 g of the solution from step A. The resulting polymer is stored as a 20% (w/w) solution in a water/methanol mixture.

The thermally switchable polymer may also comprise spiro-quaternary ammonium cations that are any one of the following cations:

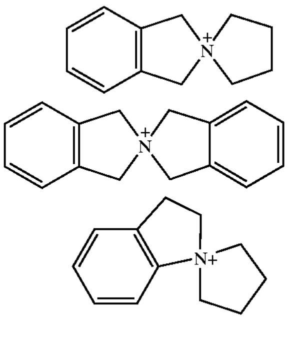

or

In another embodiment of this invention, the thermally switchable polymers useful in this invention generally may also be any of a wide variety of crosslinked vinyl homopolymers and copolymers having the requisite organoonium groups. They are prepared from ethylenically unsaturated polymerizable monomers using any conventional polymerization techniques. Procedures and reactants needed to prepare all of these types of polymers are well known. With the additional teaching provided herein, the known polymer reactants and conditions can be modified by a skilled artisan to incorporate or attach a suitable pendant cationic group.

Preferably, the polymers are copolymers prepared from two or more ethylenically unsaturated polymerizable monomers, at least one of which contains the desired organoonium group, and one or more other monomers that are capable of providing crosslinking in the polymer and possibly adhesion to the support.

The thermally switchable polymers useful in this embodiment of the invention can be composed of recurring units having more than one type of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group.

The presence of an organoonium group (such as an organoammonium or quaternary ammonium group, organophosphonium or organosulfonium group) apparently provides or facilitates the "switching" of the imageable composition from hydrophilic to oleophilic in the exposed areas upon exposure to energy that provides or generates heat, when the cationic moiety reacts with its counterion. The net result is the loss of charge. Such reactions are more easily accomplished when the anion of the organoonium group is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The organoonium group is present in sufficient recurring units of the polymer so that the heat-activated reaction described above can occur to provide desired oleophilicity of the imaged composition printing surface. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the polymer provides the desired positive charge. Generally, preferred pendant organoonium groups can be illustrated by the following structures I, II and III:

I

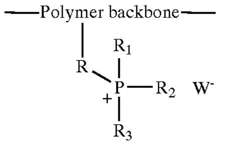

II

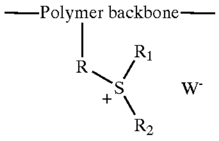

III

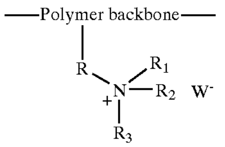

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1-4-cyclohexylene). In addition, R can be combinations of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_1$, $R_2$ and $R_3$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_1$, $R_2$ and $R_3$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium and pyrrolidinium groups for Structure III. Other useful substituents for these various groups would be readily apparent to one skilled in the art, and any combinations of the expressly described substituents are also contemplated.

Preferably, $R_1$, $R_2$ and $R_3$ are independently substituted or unsubstituted methyl or ethyl groups.

$W^-$ is any suitable anion as described above. Acetate and chloride are preferred anions.

Polymers containing quaternary ammonium groups as described herein are most preferred in the practice of this embodiment of the invention.

In preferred embodiments, the polymers useful in the practice of this invention can be represented by the following Structure IV:

IV

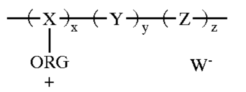

wherein X represents recurring units to which the organoonium groups ("ORG") are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various recurring units are present in suitable amounts, as represented by x being from about 50 to about 99 mol %, y being from about 1 to about 20 mol %, and z being from 0 to about 49 mol %. Preferably, x is from about 80 to about 98 mol %, y is from about 2 to about 10 mol % and z is from 0 to about 18 mol %.

Crosslinking of the polymer can be achieved in a number of ways. There are numerous monomers and methods for crosslinking that are familiar to one skilled in the art. Some representative crosslinking strategies include, but are not limited to:

- the reaction of an amine or carboxylic acid or other Lewis basic units with diepoxide crosslinkers,
- the reaction of epoxide units within the polymer with difunctional amines, carboxylic acids, or other difunctional Lewis basic unit, the irradiative or radical-initiated crosslinking of double bond-containing units such as acrylates, methacrylates, cinnamates, or vinyl groups, the reaction of multivalent metal salts with ligating groups within the polymer (the reaction of zinc salts with carboxylic acid-containing polymers is an example), the use of crosslinkable monomers that react via the Knoevenagel condensation reaction, such as (2-acetoacetoxy)ethylacrylate and methacrylate, the reaction of amine, thiol, or carboxylic acid groups with a divinyl compound [such as bis(vinylsulfonyl) methane] via a Michael addition reaction, the reaction of carboxylic acid units with crosslinkers having multiple aziridine units, the reaction of crosslinkers having multiple isocyanate units with amines, thiols, or alcohols within the polymer, mechanisms involving the formation of interchain sol-gel linkages [such as the use of the 3-(trimethoxysilyl) propylmethacrylate monomer], oxidative crosslinking using an added radical initiator (such as a peroxide or hydroperoxide), autoxidative crosslinking, such as employed by alkyd resins, sulfur vulcanization, and processes involving ionizing radiation.

Monomers having crosslinking groups or active crosslinkable sites (such as attachment sites for epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Preferred crosslinking is provided by the reaction of an amine-containing pendant group (such as N-aminopropylacrylamide hydrochloride) with a difunctional or trifunctional additive, such as a bis(vinylsulfonyl) compound.

Additional monomers that provide the additional recurring units represented by "Z" in Structure IV include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid and vinyl halides.

Preferred polymers useful in the practice of this invention include any of Polymer 1, Polymer 2, Polymer 3, Polymer 4, Polymer 5, Polymer 6, Polymer 7, or Polymer 8, as identified in U.S. Pat. No. 6,190,830, which is incorporated herein by reference. A mixture of any two or more of these polymers can also by used. Several synthetic methods for the preparation of such polymers are disclosed in U.S. Pat. No. 6,190,830.

The imageable composition of this invention can include one or more of such homopolymers or copolymers, with or without minor amounts (less than 20 weight %) based on total dry weight of the layer of additional binder or polymeric materials that will not adversely affect its imaging properties. If a blend of polymers is used, they can comprise the same or different types of organoammonium, organophosphonium or organosulfonium groups. Such polymers are readily prepared using known reactants and polymerization techniques and chemistry described in a number of polymer textbooks. Monomers can be readily prepared using known procedures or purchased from a number of commercial sources.

In another preferred embodiment of this invention, the thermally switchable polymers are charged polymers (ionomers) which can be of two broad classes of materials:

I) crosslinked or uncrosslinked vinyl polymers comprising recurring units comprising positively-charged, pendant N-alkylated aromatic heterocyclic groups; and II) crosslinked or uncrosslinked polymers comprising recurring organoonium groups.

Each class of polymer is described in turn. The imageable composition can include mixtures of polymers from each class, or a mixture of one or more polymers of two or more classes. The Class II polymers are particularly preferred. Such polymers are also described in U.S. patent application Ser. No. 09/293,389 and PCT/US00/07918.

Class I Polymers:

The Class I polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counterion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the structure:

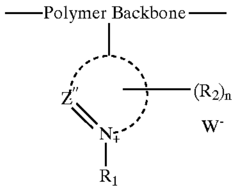

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is a substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is a substituted or unsubstituted methyl or ethyl group.

Z" represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in the above structure, n is 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following structure:

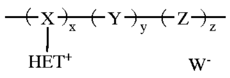

wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various repeating units are present in suitable amounts, as represented by x being from about 20 to 100 mol %, y being from about 0 to about 20 mol %, and z being from 0 to 80 mol %. Preferably, x is from about 30 to about 98 mol %, y is from about 2 to about 10 mol % and z is from 0 to about 68 mol %.

Crosslinking of the polymers can be provided in a number of ways. There are numerous monomers and methods for crosslinking that are familiar to one skilled in the art. Some representative crosslinking strategies include, but are not necessarily limited to:

(a) reacting an amine or carboxylic acid or other Lewis basic units with diepoxide crosslinkers;

(b) reacting an epoxide units within the polymer with difunctional amines, carboxylic acids, or other difunctional Lewis basic unit;

(c) irradiative or radical-initiated crosslinking of double bond-containing units such as acrylates, methacrylates, cinnamates, or vinyl groups;

(d) reacting a multivalent metal salts with ligating groups within the polymer (the reaction of zinc salts with carboxylic acid-containing polymers is an example);

(e) using crosslinkable monomers that react via the Knoevenagel condensation reaction, such as (2-acetoacetoxy)ethyl acrylate and methacrylate;

(f) reacting an amine, thiol, or carboxylic acid groups with a divinyl compound (such as bis (vinylsulfonyl) methane) via a Michael addition reaction;

(g) reacting a carboxylic acid units with crosslinkers having multiple aziridine units;

(h) reacting a crosslinkers having multiple isocyanate units with amines, thiols, or alcohols within the polymer;

(i) mechanisms involving the formation of interchain sol-gel linkages (such as the use of the 3-(trimethoxysilyl) propylmethacrylate monomer);

(j) oxidative crosslinking using an added radical initiator (such as a peroxide or hydroperoxide);

(k) autooxidative crosslinking, such as employed by alkyd resins;

(l) sulfur vulcanization; and (m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by Z in the above structure include any useful hydrophilic or oleophilic ethylenically unsaturated polymerizable monomer that may provide desired physical or printing properties to the imageable composition. Such monomers include, but are not limited to, acrylates, methacrylates, isoprene, acrylonitrile, styrene and styrene derivatives, acrylamides, methacrylamides, acrylic or methacrylic acid and vinyl halides.

Representative Class I polymers are identified hereinbelow as Polymers A and C–F. Mixtures of these polymers can also be used. Polymer B below is a precursor to a useful Class I polymer.

Class II Polymers

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides and polybenzimidazoles. Preferably, such non-vinyl polymers are silicon based sol gels, polyarylene oxides, poly (phenylene sulfide) ionomers or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325, U.S. Pat. No. 2,574,902 and U.S. Pat. No. 2,597,872. Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imageable composition from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer (at least 20 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I polymers. The halides and carboxylates are preferred.

Representative Class II non-vinyl polymers are identified herein below as Polymers G–H and J. Mixtures of these polymers can also be used. Polymer I is a precursor to Polymer J.

In addition, vinyl Class II polymers can be used in the practice of this invention. Like the non-vinyl polymers, such heat-sensitive polymers are composed of recurring units having one or more types of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group. Useful anions in these polymers are the same as those described above for the non-vinyl polymers. In addition, the halides and carboxylates are preferred.

The organoonium group is present in sufficient recurring units of the polymer so that the heat-activated reaction described above can occur to provide desired hydrophobicity of the imageable composition. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

Polymers A and C–F are illustrative of Class I polymers (Polymer B is a precursor to Polymer C), Polymers G–H and J are illustrative of Class II non-vinyl polymers (Polymer I is a precursor to Polymer J), and Polymers K–R are illustrative of Class II vinyl polymers. The synthesis of these polymers is described below, and is also described in U.S. patent application Ser. No. 09/293,389 and PCT/US00/07918.

Synthetic Methods

Preparation of Polymer A: Poly (1-vinyl-3-methylimidazolium chloride-co-N-(3-aminopropyl) Methacrylamide Hydrochloride)

A. Preparation of 1-Vinyl-3-methylimidazolium methanesulfonate monomer: Freshly distilled 1-vinylimidazole (20.00 g, 0.21 mol) is combined with methyl methanesulfonate (18.9 ml, 0.22 mol) and 3-t-butyl-4-hydroxy-5-methylphenyl sulfide (about 1 mg) in diethyl ether (100 ml) in a round bottomed flask equipped with a reflux condenser and a nitrogen inlet and stirred at room temperature for 48 hours. The resulting precipitate is filtered off, thoroughly washed with diethyl ether, and dried overnight under vacuum at room temperature to afford a product.

B. Copolymerization/ion exchange: 1-Vinyl-3-methylimidazolium methanesulfonate (5.00 g, $2.45\times10^{-2}$ mol), N-(3-aminopropyl) methacrylamide hydrochloride (0.23 g, $1.29\times10^{-3}$ mol) and 2,2'-azobisisobutyronitrile (AIBN) (0.052 g, $3.17\times10^{-4}$ mol) are dissolved in methanol (60 ml) in a 250 ml round bottomed flask equipped with a rubber septum. The solution is bubble degassed with nitrogen for ten minutes and heated at 60° C. in a water bath for 14 hours. The viscous solution is precipitated into 3.5 liters of tetrahydrofuran and dried under vacuum overnight at 50° C. to give a product. The polymer is then dissolved in 100 ml methanol and converted to the chloride by passage through a flash column containing 400 $cm^3$ DOWEX® 1×8–100 ion exchange resin.

Preparation of Polymer B: Poly(methyl methacrylate-co-4-vinylpyridine) (9:1 Molar Ratio)

Methyl methacrylate (30 ml), 4-vinylpyridine (4 ml), AIBN (0.32 g, $1.95\times10^{-3}$ mol), and N,N-dimethylformamide (40 ml, DMF) are combined in a 250 ml round bottomed flask and fitted with a rubber septum. The solution is purged with nitrogen for 30 minutes and heated for 15 hours at 60° C. Methylene chloride and DMF (150 ml of each) are added to dissolve the viscous product and the product solution is precipitated twice into isopropyl ether. The precipitated polymer is filtered and dried overnight under vacuum at 60° C.

Preparation of Polymer C: Poly(methyl methacrylate-co-N-methyl-4-vinylpyridinium formate) (9:1 Molar Ratio)

Polymer B (10 g) is dissolved in methylene chloride (50 ml) and partially reacted with methyl p-toluenesulfonate (1 ml) at reflux for 15 hours. The partially reacted product is precipitated into hexane, then dissolved in neat methyl methanesulfonate (25 ml) and heated at 70° C. for 20 hours. The product is precipitated once into diethyl ether and once into isopropyl ether from methanol and dried under vacuum overnight 60° C. A flash chromatography column is loaded with 300 $cm^3$ of DOWEX® 550 hydroxide ion exchange resin in water eluent. This resin is converted to the formate by running a liter of 10% formic acid through the column. The column and resin are thoroughly washed with methanol, and the product polymer is dissolved in methanol and passed through the column.

Preparation of Polymer D: Poly(methyl methacrylate-co-N-butyl-4-vinylpyridinium formate) (9:1 Molar Ratio)

Polymer B (5 g) is heated at 60° C. for 15 hours in 1-bromobutane (200 ml). The precipitate that forms is dissolved in methanol, precipitated into diethyl ether, and dried for 15 hours under vacuum at 60° C. The polymer is converted from the bromide to the formate using the method described in the preparation of Polymer C.

Preparation of Polymer E: Poly(methyl methacrylate-co-2-vinylpyridine) (9:1 Molar Ratio)

Methyl methacrylate (18 ml), 2-vinylpyridine (2 ml), AIBN (0.16 g,), and DMF (30 ml) are combined in a 250 ml round bottomed flask and fitted with a rubber septum. The solution is purged with nitrogen for 30 minutes and heated for 15 hours at 60° C. Methylene chloride (50 ml) is added to dissolve the viscous product and the product solution is precipitated twice into isopropyl ether. The precipitated polymer is filtered and dried overnight under vacuum at 60° C.

Preparation of Polymer F: Poly(methyl methacrylate-co-N-methyl-2-vinylpyridinium formate) (9:1 Molar Ratio)

Polymer E (10 g) is dissolved in 1,2-dichloroethane (100 ml) and reacted with methyl p-toluenesulfonate (15 ml) at 70° C. for 15 hours. The product is precipitated twice into diethyl ether and dried under vacuum overnight at 60° C. A sample of this polymer is converted from the p-toluenesulfonate to the formate using the procedure described above for Polymer C.

Preparation of Polymer G: Poly(p-xylidenetetrahydrothiophenium chloride)

Xylylene-bis-tetrahydrothiophenium chloride (5.42 g, 0.015 mol) is dissolved in 75 ml of deionized water and filtered through a fritted glass funnel to remove a small amount of insolubles. The solution is placed in a three-neck round-bottomed flask on an ice bath and sparged with nitrogen for fifteen minutes. A solution of sodium hydroxide (0.68 g, 0.017 mol) is added dropwise over fifteen minutes via addition funnel. When about 95% of the hydroxide solution is added, the reaction solution becomes very viscous and the addition is stopped. The reaction is brought to pH 4 with 10% HCl and purified by dialysis for 48 hours.

Preparation of Polymer H: Poly(phenylene sulfide-co-methyl(4-thiophenyl)sulfonium chloride)

Poly (phenylene sulfide) (15.0 g, 0.14 mol-repeating units), methanesulfonic acid (75 ml), and methyl triflate (50.0 g, 0.3 mol) are combined in a 500 ml round bottomed flask equipped with a heating mantle, reflux condenser, and nitrogen inlet. The reaction mixture is heated to 90° C. at which point a homogeneous, brown solution results and is allowed to stir at room temperature overnight. The reaction mixture is poured into 500 $cm^3$ of ice and brought to neutrality with sodium bicarbonate. The resultant liquid/solid mixture is diluted to a final volume of 2 liters with water and dialyzed for 48 hours at which point most of the solids will dissolve. The remaining solids are removed by filtration and the remaining liquids are slowly concentrated to a final volume of 700 ml under a stream of nitrogen. The polymer is ion exchanged from the triflate to the chloride by passing it through a column of DOWEX® 1×8–100 resin.

Preparation of Polymer I: Brominated poly(2,6-dimethyl-1,4-phenylene Oxide)

Poly (2,6-dimethyl-1,4-phenylene oxide) (40 g, 0.33 mol repeating units) is placed dissolved in carbon tetrachloride (2400 ml) in a 5 liter round bottomed 3-neck flask with a reflux condenser and a mechanical stirrer. The solution is heated to reflux and a 150 Watt flood lamp is applied. N-bromosuccinimide (88.10 g, 0.50 g) is added portionwise over 3.5 hours, and the reaction is allowed to stir at reflux for an additional hour. The reaction is cooled to room temperature to yield an orange solution over a brown solid. The liquid is decanted and the solids are stirred with 100 ml methylene chloride to leave a white powder (succinimide) behind. The liquid phases are combined, concentrated to 500 ml via rotary evaporation, and precipitated into methanol to yield a yellow powder. The crude product is precipitated twice more into methanol and dried overnight under vacuum at 60° C.

Preparation of Polymer J: Dimethyl Sulfonium Bromide Derivative of Poly (2,6-dimethyl-1,4-phenylene oxide)

Brominated poly(2,6-dimethyl-1,4-phenylene oxide) described above (2.00 g, 0.012 mol benzyl bromide units) is dissolved in methylene chloride (20 ml) in a 3-neck round bottomed flask outfitted with a condenser, nitrogen inlet, and septum. Water (10 ml) is added along with dimethyl sulfide (injected via syringe) and the two-phase mixture is stirred at room temperature for one hour and then at reflux at which point the reaction turned into a thick dispersion. This is poured into 500 ml of tetrahydrofuran and agitated vigorously in a chemical blender. The product, which gells after approximately an hour in the solid state, is recovered by filtration and quickly redissolved in 100 ml methanol and stored as a methanolic solution.

Preparation of Polymer K: Poly(methyl methacrylate-co-2-trimethylammoniumethyl methacrylic chloride-co-N-(3-aminopropyl) methacrylamide hydrochloride) (7:2:1 Molar Ratio)

Methyl methacrylate (24.6 ml, 0.23 mol), 2-trimethylammoniumethyl methacrylic chloride (17.0 g, 0.08 mol), n-(3-aminopropyl) methacrylamide hydrochloride (10.0 g, 0.56 mol), azobisisobutyronitrile (0.15 g, $9.10\times10^{-4}$ mol, AIBN), water (20 ml) and dimethylformamide (150 ml) are combined in a round bottom flask fitted with a rubber septum. The solution is bubble degassed with nitrogen for 15 minutes and placed in a heated water bath at 60° C. overnight. The viscous product solution is diluted with methanol (125 ml) and precipitated three times from methanol into isopropyl ether. The product is dried under vacuum at 60° C. for 24 hours and stored in a dessicator.

Preparation of Polymer L: Poly(methyl methacrylate-co-2-trimethylammoniumethyl methacrylic acetate-co-N-(3-aminopropyl) methacrylamide) (7:2:1 Molar Ratio)

Polymer K (3.0 g) is dissolved in 100 ml of methanol and neutralized by passing through a column containing 300 $cm^3$ of tertiary amine functionalized crosslinked polystyrene resin (Scientific Polymer Products # 726, 300 $cm^2$) with methanol eluent. That polymer is then converted to the acetate using a column of 300 $cm^3$ DOWEX® 1×8–100 ion exchange resin (that is, converted from the chloride to the acetate by washing with 500 ml glacial acetic acid) and methanol eluent.

Preparation of Polymer M: Poly(methyl methacrylate-co-2-trimethylammoniumethyl methacrylic fluoride-co-N-(3-aminopropyl) methacrylamide hydrochloride) (7:2:1 Molar Ratio)

Polymer K (3.0 g) is dissolved in 100 ml of methanol and neutralized by passing through a column containing 300 $cm^3$ tertiary amine functionalized crosslinked polystyrene resin (Scientific Polymer Products # 726, 300 $cm^2$) with methanol eluent. The polymer is then converted to the fluoride using a column of 300 $cm^3$ DOWEX® 1×8–100 ion exchange resin (that is, converted from the chloride to the fluoride by washing with 500 g of potassium fluoride) and methanol eluent.

Preparation of Polymer N: Poly(vinylbenzyl trimethylammonium chloride-co-N-(3-aminopropyl) methacrylamide hydrochloride) (19:1 Molar Ratio)

Vinylbenzyl trimethylammonium chloride (19 g, 0.0897 mol, 60:40 mixture of p,m isomers), N-(3-aminopropyl) methacrylamide hydrochloride (1 g, 0.00562 mol), 2,2'-azobis(2-methylpropionamidine) dihydrochloride (0.1 g), and deionized water (80 ml) are combined in a round bottom flask fitted with a rubber septum. The reaction mixture is bubble degassed with nitrogen for 15 minutes and placed in a water bath at 60° C. for four hours. The resulting viscous product solution is precipitated into acetone, dried under vacuum at 60° C. for 24 hours, and stored in a dessicator.

Preparation of Polymer O: Poly(vinylbenzyltrimethylphosphonium acetate-co-N-(3-aminopropyl) methacrylamide hydrochloride) (19:1 Molar Ratio)

A. Vinylbenzyl bromide (60:40 mixture of p,m isomers), vinylbenzyl chloride (50.60 g, 0.33 mol, 60:40 mixture of p,m isomers), sodium bromide (6.86 g, $6.67\times10^{-2}$ mol), N-methylpyrrolidone (300 ml, passed through a short column of basic alumina), ethyl bromide (260 g), and 3-t-butyl-4-hydroxy-5-methyl phenyl sulfide (1.00 g, $2.79\times10^{-3}$ mol) are combined in a 1 liter round bottomed flask fitted with a reflux condenser and a nitrogen inlet and the mixture is heated at reflux for 72 hours at which point the reaction has proceeded to >95% conversion. The reaction mixture is poured into 1 liter of water and extracted twice with 300 ml of diethyl ether. The combined ether layers are extracted twice with 1 liter of water, dried over $MgSO_4$, and the solvents are stripped by rotary evaporation to yield yellowish oil. The crude product is purified by vacuum distillation.

B. Vinylbenzyl trimethylphosphonium bromide: Trimethylphosphine (50.0 ml of a 1.0 molar solution in tetrahydrofuran, $5.00\times10^{-2}$ mol) is added via addition funnel over about 2 minutes into a thoroughly nitrogen degassed dispersion of vinylbenzyl bromide (9.85 g, $5.00\times10^{-2}$ mol) in diethyl ether (100 ml). A solid precipitate begins to form almost immediately. The reaction is allowed to stir for 4 hours at room temperature, then is placed in a freezer overnight. The solid product is isolated by filtration, washed three times with 100 ml of diethyl ether, and dried under vacuum for 2 hours. Pure product is recovered as a white powder.

C. Poly (vinylbenzyltrimethylphosphonium bromide-co-N-(3-aminopropyl)methacrylamide) (19:1 molar ratio): Vinylbenzyltrimethylphosphonium bromide (5.00 g, $1.83\times10^{-2}$ mol), N-(3-aminopropyl) methacrylamide hydrochloride (0.17 g, $9.57\times10^{-4}$ mol), azobisisobutyronitrile (0.01 g, $6.09\times10^{-5}$ mol), water (5.0 ml), and dimethylformamide (25 ml) are combined in a 100 ml round bottomed flask sealed with a rubber septum, bubble degassed for 10 minutes with nitrogen, and placed in a warm water bath (55° C.) overnight. The viscous solution is precipitated into tetrahydrofuran and dried under vacuum overnight at 60° C. The liquids are filtered off, concentrated on a rotary evaporator to a volume of about 200 ml, precipitated again into tetrahydrofuran, and dried under vacuum overnight at 60° C.

D. Poly (vinylbenzyltrimethylphosphonium acetate-co-N-(3-aminopropyl) methacrylamide hydrochloride) (19:1 molar ratio): DOWEX® 550 (a hydroxide anion exchange resin) (about 300 $cm^3$) is poured into a flash column with 3:1 methanol/water eluent. About 1 liter of glacial acetic acid is passed through the column to convert it to the acetate, followed by about 3 liters of 3:1 methanol/water. 3.0 g of the product from step C in 200 ml of 3:1 methanol/water is passed through the acetate resin column and the solvents are stripped on a rotary evaporator. The resulting viscous oil was thoroughly dried under vacuum to afford a glassy, yellowish material (Polymer O).

Preparation of Polymer P: Poly (dimethyl-2-(methacryloyloxy) ethylsulfonium chloride-co-N-(3-aminopropyl) methacrylamide hydrochloride) (19:1 Molar Ratio)

A. Dimethyl-2-(methacryloyloxy) ethylsulfonium methylsulfate: 2-(Methylthio) ethylmethacrylate (30.00 g, 0.19 mol), dimethyl sulfate (22.70 g, 0.18 mol), and benzene (150 ml) are combined in a 250 ml round bottomed flask outfitted with a reflux condenser and a nitrogen inlet. The reaction solution is heated at reflux for 1.5 hours and allowed to stir at room temperature for 20 hours at which point the reaction has proceeded to about 95% yield. The solvent is removed by rotary evaporation to afford brownish oil that is stored as a 20 wt. % solution in dimethylformamide and used without further purification.

B. Poly (dimethyl-2-(methacryloyloxy) ethylsulfonium methylsulfate-co-N-(3-aminopropyl) methacrylamide hydrochloride) (19:1 molar ratio): Dimethyl-2-(methacryloyloxy) ethylsulfonium methylsulfate (93.00 g of 20 wt. % solution in dimethylformamide, $6.40\times10^{-2}$ mol), N-(3-aminopropyl) methacrylamide hydrochloride (0.60 g, $3.36\times10^{-3}$ mol), and azobisisobutyronitrile (0.08 g, $4.87\times10^{-4}$ mol) are dissolved in methanol (100 ml) in a 250 ml round bottomed flask fitted with a septum. The solution is bubble degassed with nitrogen for 10 minutes and heated for 20 hours in a warm water bath at 55° C. The reaction is precipitated into ethyl acetate, redissolved in methanol, precipitated a second time into ethyl acetate, and dried under vacuum overnight. A white powder is recovered.

C. Poly (dimethyl-2-(methacryloyloxy) ethylsulfonium chloride-co-N-(3-aminopropyl) methacrylamide hydrochloride) (19:1 molar ratio): The precursor polymer (2.13 g) from step B is dissolved in 100 ml of 4:1 methanol/water and passed through a flash column containing 300 $cm^3$ of DOWEX® 1x8–100 anion exchange resin using 4:1 methanol/water eluent. The recovered solvents are concentrated to about 30 ml and precipitated into 300 ml of methyl ethyl ketone. The damp, white powder collected is redissolved in 15 ml of water and stored in a refrigerator as a solution of Polymer P.

Preparation of Polymer Q: Poly (vinylbenzyldimethylsulfonium methylsulfate)

A. Methyl (vinylbenzyl) sulfide: sodium methanethiolate (24.67 g, 0.35 mol) is combined with methanol (250 ml) in a 1 liter round bottomed flask outfitted with an addition funnel and a nitrogen inlet. Vinylbenzyl chloride (41.0 ml, 60:40 mixture of p and o isomers, 0.29 mol) in tetrahydrofuran (100 ml) is added via addition funnel over 30 minutes. The reaction mixture grows slightly warm and a milky suspension is obtained. This is allowed to stir at room temperature for 20 hours. Another portion of sodium methanethiolate is added (5.25 g, $7.49\times10^{-2}$ mol) and after ten minutes, the reaction has proceeded to completion. Diethyl ether (400 ml) is added and the resulting mixture is extracted twice with 600 ml of water and once with 600 ml of brine. The resulting organic extracts are dried over magnesium sulfate, a small amount (about 1 mg) of 3-t-butyl-4-hydroxy-5-methyl phenyl sulfide is added, and the solvents are stripped by rotary evaporation to afford a yellowish oil. Purification by vacuum distillation through a long Vigreux column yields the pure product as a clear liquid B. Dimethyl (vinylbenzyl) sulfonium methylsulfate: methyl (vinylbenzyl) sulfide (13.59 g, $8.25\times10^{-2}$ mol), benzene (45 ml), and dimethyl sulfate (8.9 ml, $9.4\times10^{-2}$ mol) are combined in a 100 ml round bottomed flask equipped with a nitrogen inlet and allowed to stir at room temperature for 44 hours, at which point two layers are present. Water (20 ml) is added and the top (benzene) layer is removed by pipette. The aqueous layer is extracted three times with 30 ml of diethyl ether and a vigorous stream of nitrogen is bubbled through the solution to remove residual volatile compounds. The product is used without further purification as a 35% (w/w) solution.

C. Poly (dimethyl (vinylbenzyl) sulfonium methylsulfate): All of the dimethyl (vinylbenzyl) sulfonium methylsulfate solution from the previous step (approximately $5.7\times10^{-2}$ mol) is combined with water (44 ml) and sodium persulfate (0.16 g, $6.72\times10^{-4}$ mol) in a 200 ml round bottomed flask fitted with a rubber septum. The reaction solution is bubble degassed with nitrogen for ten minutes and heated for 24 hours in a water bath at 50° C. Additional sodium persulfate (0.16 g, $6.72\times_{10}{}^{-4}$ mol) is added and the reaction is allowed to proceed for 18 more hours at 50° C. The solution is precipitated into acetone and immediately redissolved in water to give 100 ml of a solution of Polymer Q.

Preparation of Polymer R: Poly (vinylbenzyldimethylsulfonium chloride)

The aqueous product solution of Polymer Q (16 ml, ~4.0 g solids) is precipitated into a solution of benzyltrimethylammonium chloride (56.0 g) in isopropanol (600 ml). The solvents are decanted and the solids are washed by stirring for 10 minutes in 600 ml of isopropanol and quickly dissolved in water to give 35 ml of a solution of Polymer R (11.1% solids). There is >90% conversion to the chloride.

FIG. 1 shows a prior art configuration of a printing section of a lithographic printing press which may be used in the method and system of this invention. FIG. 1 and its description herein correspond in part to FIG. 1 and the accompanying description thereof in U.S. Pat. No. 5,713,287, which is incorporated herein by reference.

Referring now to FIG. 1 representing the printing section of a lithographic press, paper 1 (either in sheet or web form) is compressed between impression cylinder 2 and blanket cylinder 3. Blanket cylinder 3 is in contact with image cylinder 4 which replaces the plate cylinder in a conventional press. The main difference is that image cylinder 4 is a seamless cylinder, thus being able to run faster and with no vibration compared to a plate cylinder having an elongated gap along the length of the image cylinder (not shown) for clamping the plate. The image cylinder 4 is inked by a water/ink system using fount solution roller 5 and ink roller 6. Rollers 5 and 6 will be merged in some inking systems known as an "integrated" inking chain. Alternatively, the press can operate in waterless offset (also known as "dry offset") mode in which fount solution rollers 5 are not used. As used herein, "waterless" offset printing includes printing using single fluid inks, as well as printing using pre-emulsified inks where fountain solution rollers are not required. A cleaning unit 7 is mounted near image cylinder 4. The cleaning unit is similar to the well-known "blanket washer" units employed in modern presses to clean the blanket cylinder between print runs. However, unlike the cleaning unit described in U.S. Pat. No. 5,713,287 which is capable of washing off most of the ink, water or fountain solution and imaged layer used on a previous print run, the cleaning unit 7 employed in this invention is only capable of removing the printing fluid used on a previous print run without substantially removing the prior imaged coating or coatings applied to the cylinder 4 and used in a prior print run or runs. In contrast, in the cleaning unit described in U.S. Pat. No. 5,713,287 extra solvents may have to be added to dissolve most of the prior imaged layer. Additional cleaning units can also be used in this invention to clean blanket cylinder 3 and other cylinders in accordance with modem press design.

A linear track 9 is rigidly mounted parallel to image cylinder 4. A traveling carriage 8 traverses image cylinder 4 under the control of motor 11 and lead screw 10. The motion of image cylinder 4 and motor 11 are synchronized using shaft encoders in a manner similar to all drum imaging devices. Drum imaging devices are well known and have been commercially available for many years. Thus, no further details of the synchronization and handling of the image data will be given. A coating unit 12 and imaging unit 14 are mounted on carriage 8 and capable of traversing the full width of image cylinder 4. Coating unit 12 sprays a solution containing a composition which changes affinity for a printing fluid upon exposure to imaging radiation, preferably a solution containing a thermally switchable polymer as described herein, onto image cylinder 4, after the image cylinder 4 has been cleaned. Alternatively, the solution can be applied by a roller, similar to printing fluid (e.g. ink) application. The liquid polymer-containing composition must be dried upon the cylinder under conditions sufficient to provide a solid polymer film which is preferably cross-linked or cured to render the solid polymer film insoluble in fount solution or other "press fluids." The cross-linking or curing may occur at least in part during the drying of the liquid polymer-containing composition. For example, drying of the composition on the drum over two drum revolutions using hot air at about 155° F. has been found insufficient, without overnight curing. The thickness of the polymer layer is typically from 1 to 10 microns.

The polymer layer forms an imageable coating which is imaged by imaging radiation. Imaging radiation such as IR, UV, and UV-vis radiation may be used in this invention. In this particular embodiment of the invention, the imageable coating is imaged by a multi-channel laser head 14. In order to image the complete surface of image cylinder 4 in a short time (in the order of one or two minutes) a large number of beams are required as well as a relatively high power. Multi-beam laser imagers are well known. By the way of example, a laser array is described in U.S. Pat. No. 4,743,091 which is incorporated herein by reference. The number of beams required depends on the required imaging time, power, and the maximum rotational speed of the image cylinder 4. While the cleaning, coating and imaging is done, the press is in the "impression off" mode. In this mode the image cylinder 4 does not touch any of the other cylinders (same as a plate cylinder in "impression off" mode). After imaging the press is switched to "impression on" mode and the image cylinder 4 is inked in the conventional or waterless offset manner. A detailed explanation of the steps is shown in FIG. 2*a* to FIG. 2*d*.

Figure 2A:
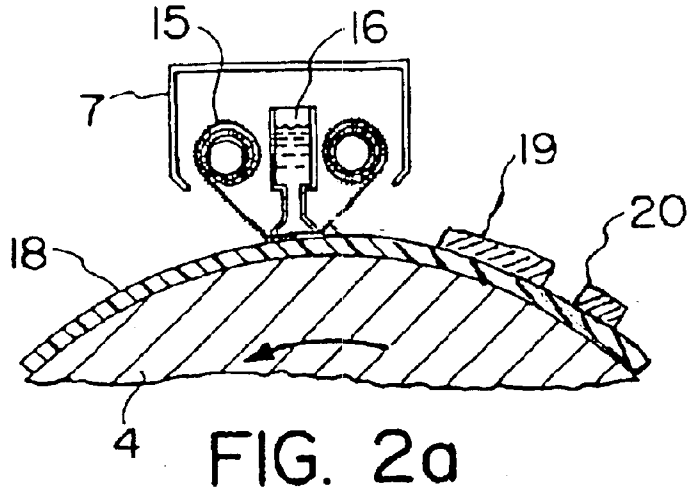
FIGS. 2*a*–2*d* depict various steps of recoating and reimaging the printing cylinder surface and imaged coating residing thereon in accordance with this invention.

Referring now to FIG. 2*a* the old image, consisting of imaged polymer coating 18 which is covered with a printing fluid 19 and, in conventional offset, water 20, may be cleaned by a conventional automatic blanket washer 7 (normally used to clean blanket cylinders). The blanket washer consists of a renewable wiping material 15, usually fed from one roll to another, and a solvent 16 used to wet the roll. Since the cylinder itself is immune to solvents and, typically made of metal, any suitable solvent capable of dissolving the old printing fluid (but not the underlying imaged coating residing on the cylinder) can be used. Alternatively, the printing fluid may be removed from the imaged coating by simply running the press for a small number of additional impressions upon completion of printing to transfer the residual printing fluid from the imaged coating prior to application of a new imageable coating onto the prior imaged coating. The cleaning need not be perfect and a very thin layer of printing fluid may remain on the imaged coating 18. Removal of the printing fluid should be sufficient that, by visible inspection, no visible layer of printing fluid remains on the imaged coating after cleaning, although a thin layer of printing fluid which could be detected via analytical techniques may remain after cleaning, and removal of the printing fluid must be sufficient to insure that no loss of adhesion occurs between the underlying imaged coating and additional imaged coating applied thereto.

Figure 2B:
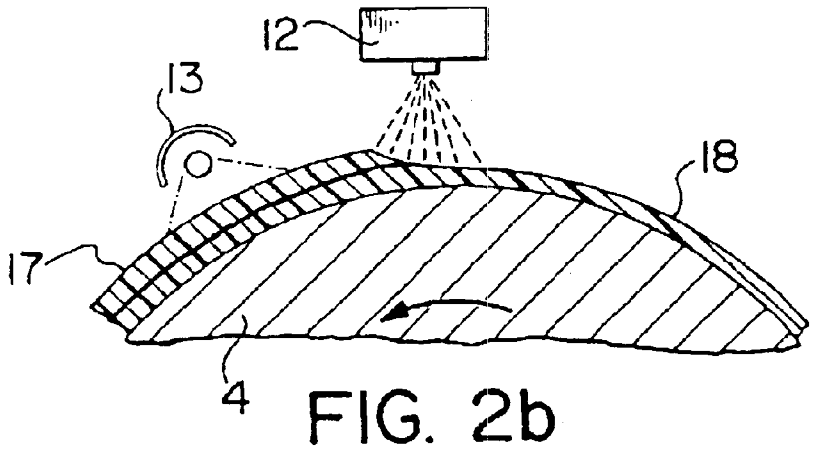

Referring now to FIG. 2*b*, a new imageable coating 17 is applied over the prior imaged coating 18 by a coating unit 12 which is equipped with a spray nozzle. Alternatively, the new imageable coating (preferably comprising a thermally switchable polymer as previously described) can be applied with a roller or any other of the common methods. Drying and crosslinking of the imageable coating 17 may be accomplished as previously described. The thickness of imageable coating 17 is typically from 2 to 10 microns but layers as thin as 1 micron can be used if their durability is sufficient.

Figure 2C:
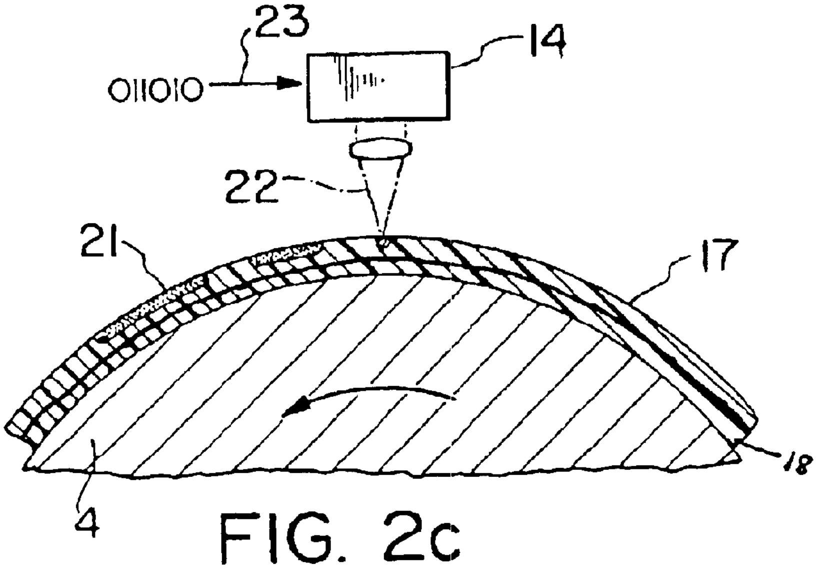

Referring now to FIG. 2*c*, the new imageable coating is imaged by a multi-channel laser head 14 according to the pre-press data files 23. Preferably, the reaction is purely thermal, so that any type of laser can be used. Laser diodes operating in the near infra-red are the preferred source. Energy requirements for the laser employed are in the range of 50 $mJ/cm^2$ to 700 $mJ/cm^2$, preferably 200–700 $mJ/cm^2$. Typically the cylinder is imaged at a resolution of 2400 DPI. The laser beam 22 modifies the imageable coating 17 from hydrophilic to hydrophobic. The imageable coating 17 contains carbon black or laser absorbing dye to absorb most of the laser energy in a thin layer, typically 1–2 micron. The temperature in this layer reaches easily 600° C. and sometimes higher; thus the chemical composition is easily modified. The modified surface, layer 21, has a different affinity to ink and water compared to the unmodified imageable coating 17. To print, the press is switched to "impression on" mode, causing the image cylinder to engage the blanket cylinder and the inking system.

Figure 2D:
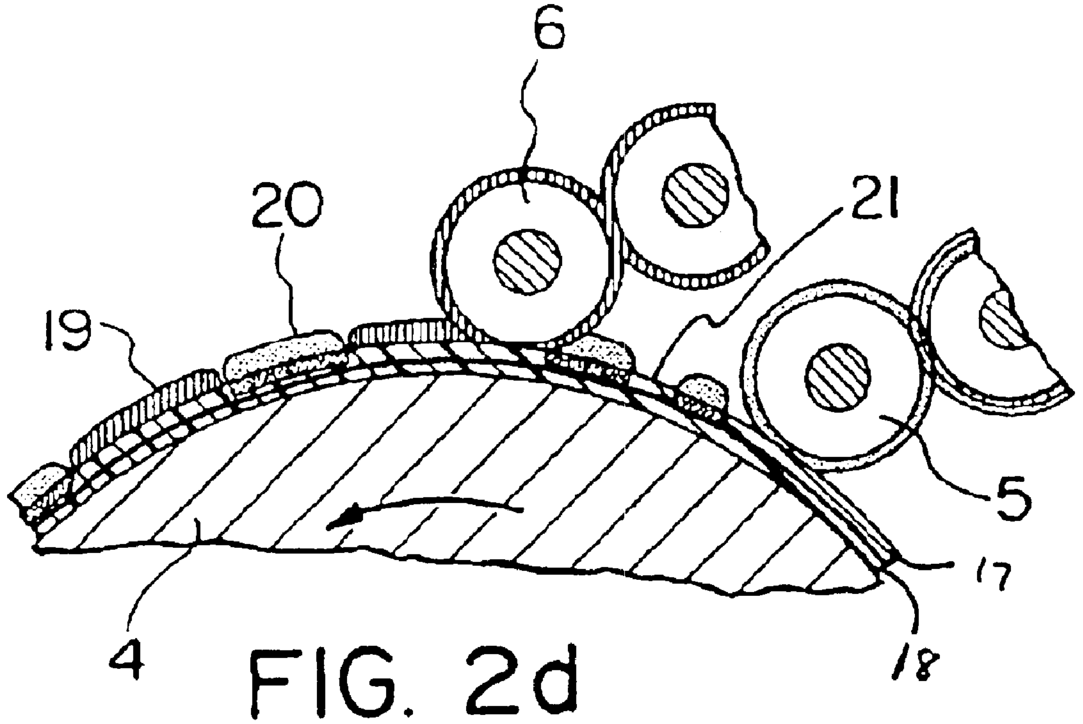

Referring now to FIG. 2*d*, fount solution roller 5 applies fount solution 20 (water) to the hydrophilic areas followed by ink rollers 6 applying a printing fluid 19 to the hydrophobic areas. In an alternate waterless offset embodiment, the fount solution and roller 5 are not used. A second alternate embodiment uses integrated inking. In an integrated inking system an ink/water emulsion is applied. From that point on, the printing proceeds in a conventional manner until the printed material has to be changed. For multi-color printing, multiple press units may be used. The on-press imaging has much improved color registrations as all registration errors caused by plate mounting are eliminated.

The following example illustrates a preferred embodiment of this invention. It will be understood that the following example is merely illustrative and is not meant to limit the invention in any way.

EXAMPLE 1

A formulation was prepared as follows:

| Component | Parts by Weight |
|---|---|
| Poly(acrylic acid)* | 0.617 |
| Benzyltrimethylammonium hydroxide* | 1.432 |
| Carbon dispersion FX-GE-003 (available from Nippon Shukubai) | 1.708 |
| Epoxide crosslinking agent CR-5L (available from Esprix Technologies) | 0.205 |
| Anionic surfactant AEROSOL OT (available from Cytec Industries) | 0.010 |
| N-propanol | 8.342 |
| Methanol | 2.153 |
| Water | 85.532 |

*The combination of poly (acrylic acid) and benzyltrimethylammonium hydroxide constitute the thermally switchable polymer.

A bar wound with 0.025 inch diameter wire was used to apply the fresh formulation onto a grained anodized aluminum substrate to provide a printing plate precursor. After the coating was thoroughly dried and cured overnight, as evidenced by the fact that application of water while rubbing did not appreciably change the appearance, the precursor was imaged on a Creo 3244 Trendsetter at a nominal power setting of 20 W and a drum speed of 121 rpm to obtain a printing plate.

The plate was mounted on a Miehle press without any processing and was used to print 4,000 impressions with an ink formulated with 2% calcium carbonate to accelerate wear. The ability to print clean 2% highlight dots at a 150 line ruling was demonstrated. At the conclusion of the print run the plate was cleaned with Kodak Production Series Cleaner/Preserver. A second layer of the fresh formulation described above was applied, dried and imaged as was done for the first layer, but with a different image file easily distinguishable from the first image file. The plate was then re-mounted on press and used to print over 1,000 clean images.

The run-length of the coating formulation used in this invention has been found to be adversely affected by age of the coating formulation, in that it has been found that a coating formulation which had been aged for about two weeks was unacceptable for use, whereas a fresh coating formulation has been found acceptable for use. Accordingly, in a preferred embodiment of this invention the coating formulation will be used less than two weeks after it has been prepared.

The invention has been described in detail with particular reference to preferred embodiments thereof, but it will be understood that variations and modifications can be effected within the spirit and scope of the invention.

We claim:

1. A direct-to-press imaging system comprising:

(a) a printing cylinder capable of receiving an imageable coating;

(b) a coating unit mounted proximate to the printing cylinder;

(c) a thin layer of an imageable composition formed on the printing cylinder by the coating unit, wherein the imageable coating comprises a composition which changes affinity for a printing fluid upon exposure to imaging radiation, and the imageable coating is substantially insoluble in the printing fluid;

(d) an imaging unit mounted proximate to the printing cylinder and operable to imagewise expose the imageable coating to actinic radiation to obtain an imaged coating;

(e) a printing fluid application unit mounted proximate to the printing cylinder and configured to apply printing fluid to the imaged coating to form a printing fluid image thereon;

(f) a transfer system mounted proximate to the printing cylinder and configured to transfer the printing fluid image to a print-receiving medium; and (g) a removal system for removing ink, printing fluid, water or a combination thereof from the imaged coating after transfer of the printing fluid image to the print receiving medium without substantially removing the imaged coating.

2. The system of claim 1 wherein a sleeve capable of receiving the imageable coating is integral to the printing cylinder.

3. The system of claim 1 wherein a sleeve capable of receiving the imageable coating is removable from the printing cylinder.

4. A direct-to-press imaging system comprising:

(a) a printing cylinder adapted to receive an imageable coating;

(b) a coating unit mounted proximate to the printing cylinder, and adapted to apply a thin layer of an imageable composition to the printing cylinder to form the imageable coating;

(c) an imaging unit mounted proximate to the printing cylinder, and adapted to imagewise deliver radiation to the imageable coating to form an imaged coating;

(d) a printing-fluid application unit mounted proximate to the printing cylinder, and adapted to apply printing fluid to the imaged coating; and (e) a means for substantially removing residual printing fluid, ink, water or a combination thereof from the imaged coating without substantially removing the imaged coating from the printing cylinder.

5. The imaging system of claim 4, wherein the printing cylinder includes a sleeve capable of receiving the imageable coating.

6. The imaging system of claim 5, wherein the sleeve is integral with the printing cylinder.

7. The imaging system of claim 5, wherein the sleeve is removable if from the printing cylinder.

8. The imaging system of claim 4, wherein the coating unit comprises a spray nozzle.

9. The imaging system of claim 4, wherein the coating unit comprises a roller.

10. The imaging system of claim 4, wherein the imaging unit comprises a laser capable of emitting the radiation.

11. The imaging system of claim 4, wherein the imaging unit comprises a multi-channel laser head.

12. The imaging system of claim 4 wherein the imaging unit is adapted to imagewise deliver thermal radiation to the imageable coating.

13. The imaging system of claim 4, wherein the means for removing includes a blanket washer.

14. The imaging system of claim 13, wherein the blanket washer further includes a wiping material and a solvent.

15. The imaging system of claim 13, wherein the means for removing includes a solvent capable of dissolving the printing fluid without substantially dissolving the imaged coating.

16. The imaging system of claim 4, further comprising a dryer.

17. The imaging system of claim 4, further comprising a transfer system mounted proximate to the printing cylinder and configured to transfer a printing fluid image to a print-receiving medium.

* * * * *